United States Patent
Kang et al.

(10) Patent No.: US 9,893,272 B2
(45) Date of Patent: Feb. 13, 2018

(54) MAGNETIC MEMORY DEVICE COMPRISING OXIDE PATTERNS

(71) Applicants: Shin-Jae Kang, Seoul (KR); Jongchul Park, Seongnam-si (KR); Byoungjae Bae, Hwaseong-si (KR); Jaesuk Kwon, Seoul (KR); Hyunsoo Shin, Bucheon-si (KR)

(72) Inventors: Shin-Jae Kang, Seoul (KR); Jongchul Park, Seongnam-si (KR); Byoungjae Bae, Hwaseong-si (KR); Jaesuk Kwon, Seoul (KR); Hyunsoo Shin, Bucheon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 37 days.

(21) Appl. No.: 14/703,842

(22) Filed: May 4, 2015

(65) Prior Publication Data

US 2016/0035969 A1   Feb. 4, 2016

(30) Foreign Application Priority Data

Jul. 30, 2014  (KR) .................. 10-2014-0097535

(51) Int. Cl.
*H01L 27/22* (2006.01)
*H01L 43/02* (2006.01)
*H01L 43/08* (2006.01)
*H01L 43/12* (2006.01)

(52) U.S. Cl.
CPC ............ *H01L 43/08* (2013.01); *H01L 27/222* (2013.01); *H01L 27/224* (2013.01); *H01L 27/228* (2013.01); *H01L 43/12* (2013.01); *H01L 43/02* (2013.01)

(58) Field of Classification Search
CPC ..... H01L 27/222; H01L 27/224; H01L 27/228; H01L 43/02
See application file for complete search history.

(56) References Cited

U.S. PATENT DOCUMENTS 8,097,531 B2   1/2012  Park et al.
8,268,713 B2   9/2012  Yamagishi et al.
(Continued)

FOREIGN PATENT DOCUMENTS

JP         11031812 A      2/1999
JP       2005277249 A     10/2005

*Primary Examiner* — Marcos D Pizarro
*Assistant Examiner* — Christopher M Roland
(74) *Attorney, Agent, or Firm* — Renaissance IP Law Group LLP

(57) ABSTRACT

A method of fabricating a magnetic memory device is provided. The method may include sequentially forming a first magnetic layer, a tunnel barrier layer, and a second magnetic layer on a substrate, forming a mask pattern on the second magnetic layer to expose a portion of the second magnetic layer, forming a capping insulating layer on a sidewall of the mask pattern and the portion of the second magnetic layer, injecting an oxygen ion into the portion of the second magnetic layer through the capping insulating layer to form an oxide layer, anisotropically etching the capping insulating layer to form a capping spacer, and patterning the oxide layer, the tunnel barrier layer, and the first magnetic layer using the mask pattern and the capping spacer.

18 Claims, 20 Drawing Sheets

(56) References Cited

U.S. PATENT DOCUMENTS

| | | | |
|---|---|---|---|
| 2004/0188732 A1* | 9/2004 | Fukuzumi | B82Y 10/00 |
| | | | 257/295 |
| 2005/0020076 A1 | 1/2005 | Lee et al. | |
| 2005/0146927 A1 | 7/2005 | Costrini | |
| 2009/0146131 A1* | 6/2009 | Happ | H01L 27/222 |
| | | | 257/5 |
| 2009/0159563 A1* | 6/2009 | Jung | H01L 43/12 |
| | | | 216/22 |
| 2009/0235018 A1* | 9/2009 | Gallagher | G11C 11/155 |
| | | | 711/104 |
| 2010/0240207 A1 | 9/2010 | Park et al. | |
| 2011/0059557 A1 | 3/2011 | Yamagishi et al. | |
| 2012/0135543 A1 | 5/2012 | Shin et al. | |
| 2012/0244639 A1* | 9/2012 | Ohsawa | H01L 43/12 |
| | | | 438/3 |
| 2013/0037895 A1 | 2/2013 | Lee et al. | |
| 2013/0171743 A1* | 7/2013 | Lee | H01L 43/12 |
| | | | 438/3 |
| 2013/0307099 A1* | 11/2013 | Kitagawa | H01L 29/82 |
| | | | 257/421 |

* cited by examiner

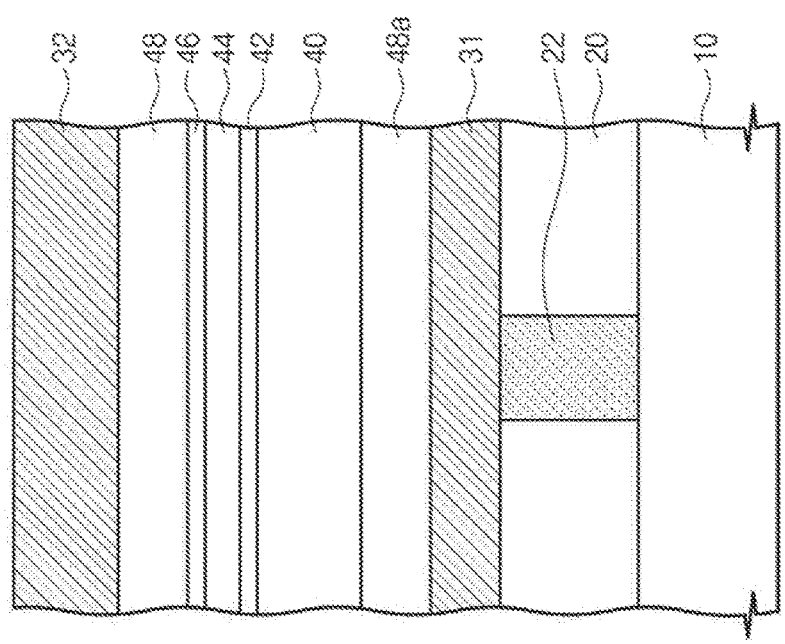
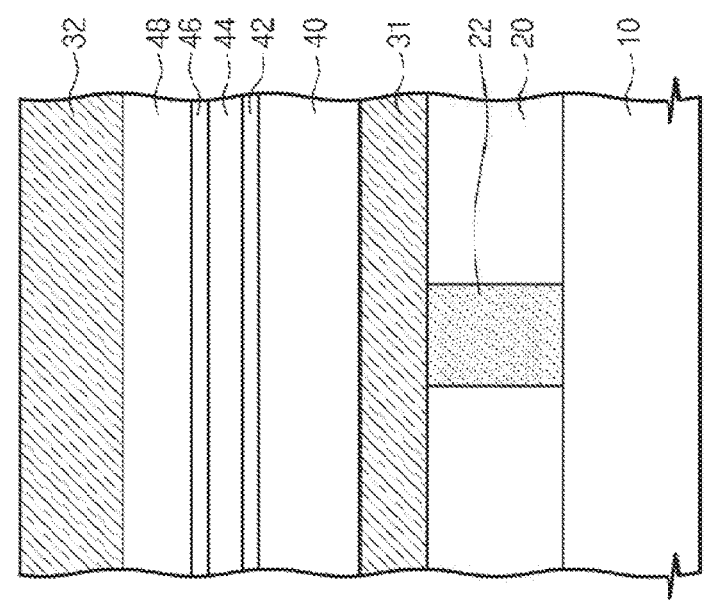

MAGNETIC MEMORY DEVICE COMPRISING OXIDE PATTERNS

CROSS-REFERENCE TO RELATED APPLICATIONS

This U.S. non-provisional patent application claims priority under 35 U.S.C. § 119 to Korean Patent Application No. 10-2014-0097535, filed on Jul. 30, 2014, in the Korean Intellectual Property Office, the entire contents of which are hereby incorporated by reference.

BACKGROUND OF THE INVENTION

Example embodiments of the inventive concepts relate to a semiconductor device, and in particular, to a magnetic memory device.

Due to the increased demand for electronic devices operating with fast speed and low power consumption, semiconductor devices for such electronic devices must operate at a fast operating speed with a low operating voltage. A magnetic memory device has been suggested to satisfy such requirements. For example, magnetic memory devices can provide technical advantages, such as low latency and non-volatility. As a result, the magnetic memory device is being regarded as an emerging next-generation memory device.

A magnetic memory device may include a magnetic tunnel junction (MTJ). A MTJ may include two magnetic layers and a tunnel barrier layer interposed therebetween. Resistance of the MTJ may vary depending on magnetization directions of the magnetic layers. For example, the resistance of the MTJ may be higher when magnetization directions of the magnetic layers are anti-parallel than when they are parallel. Such a difference in resistance can be used to store data in the magnetic memory device. However, more research is still needed to be able to efficiently and reliably mass-produce the magnetic memory device.

SUMMARY

Example embodiments of the inventive concepts provide a highly-integrated magnetic memory device.

Example embodiments of the inventive concepts also provide a highly-reliable magnetic memory device.

According to example embodiments of the inventive concepts, a method of fabricating a magnetic memory device is provided. The method may include sequentially forming a first magnetic layer, a tunnel barrier layer, and a second magnetic layer on a substrate, forming a mask pattern on the second magnetic layer to expose a portion of the second magnetic layer, forming a capping insulating layer on a sidewall of the mask pattern and the portion of the second magnetic layer, injecting an oxygen ion into the portion of the second magnetic layer through the capping insulating layer to form an oxide layer, anisotropically etching the capping insulating layer to form a capping spacer, and patterning the oxide layer, the tunnel barrier layer, and the first magnetic layer using the mask pattern and the capping spacer.

In example embodiments, injecting the oxygen ion may be performed using plasma.

In example embodiments, the method may further include etching the portion of the second magnetic layer using the mask pattern to form a re-deposition spacer layer on sidewalls of the mask pattern and the portion of the second magnetic layer, before forming the capping insulating layer. Etching the portion of the second magnetic layer may be performed to prevent the tunnel barrier layer from being exposed.

In example embodiments, the first magnetic layer may have a fixed magnetization direction, and the second magnetic layer may have a switchable magnetization direction.

In example embodiments, the capping insulating layer may include silicon oxide and/or metal oxide. The capping insulating layer may also have a thickness ranging from about 30 Å to about 50 Å.

In example embodiments, the method may further include forming an interfacial layer in contact with a top surface of the second magnetic layer. The capping insulating layer may be formed to cover a sidewall of the interfacial layer. The tunnel barrier layer and the interfacial layer may include MgO. The first and second magnetic layers may have a magnetization direction perpendicular to a top surface of the substrate.

According to additional example embodiments of the inventive concepts, a magnetic memory device may include a lower electrode on a substrate, a first magnetic pattern on the lower electrode, a second magnetic pattern on the first magnetic pattern, the second magnetic pattern having a width smaller than that of the first magnetic pattern, a tunnel barrier pattern between the first and second magnetic patterns, an upper electrode provided on the second magnetic pattern with a capping pattern interposed therebetween, a capping spacer on a sidewall of the capping pattern, and an oxide pattern extending from the second magnetic pattern to a region between the capping spacer and the tunnel barrier pattern. The oxide pattern may include a material that is the same as at least one of the materials of the second magnetic pattern.

In example embodiments, the capping spacer may include a metal oxide. The capping spacer may have a thickness ranging from about 30 Å to about 50 Å.

In example embodiments, sidewalls of the tunnel barrier pattern and the first magnetic pattern may be self-aligned to a sidewall of the capping spacer.

In example embodiments, the capping spacer may have a bottom surface arranged in contact with a top surface of the oxide pattern.

In example embodiments, a difference in width between the first and second magnetic patterns may be equal to or larger than a width of the capping spacer.

In example embodiments, the device may further include a re-deposition spacer provided between the capping pattern and the capping spacer. The re-deposition spacer may include a material that is the same as at least one of the materials of the second magnetic pattern.

According to still further example embodiments of the inventive concepts, a magnetic memory device may include a lower electrode on a substrate, a first magnetic pattern on the lower electrode, a second magnetic pattern on the first magnetic pattern, a tunnel barrier pattern between the first and second magnetic patterns, an upper electrode provided on the second magnetic pattern with a capping pattern interposed therebetween, a capping spacer on a sidewall of the capping pattern, and a metal oxide pattern extending from the second magnetic pattern to a region between the capping spacer and the tunnel barrier pattern. The first magnetic pattern, the tunnel barrier pattern, and the metal oxide pattern may have sidewalls, which are self-aligned to a sidewall of the capping spacer.

In example embodiments, a difference in width between the first and second magnetic patterns may be equal to or larger than a width of the capping spacer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3 through 9 are sectional views of a magnetic memory device during various stages of fabrication, illustrating a method of fabricating the magnetic memory device according to example embodiments of the inventive concepts.

Figure 1:
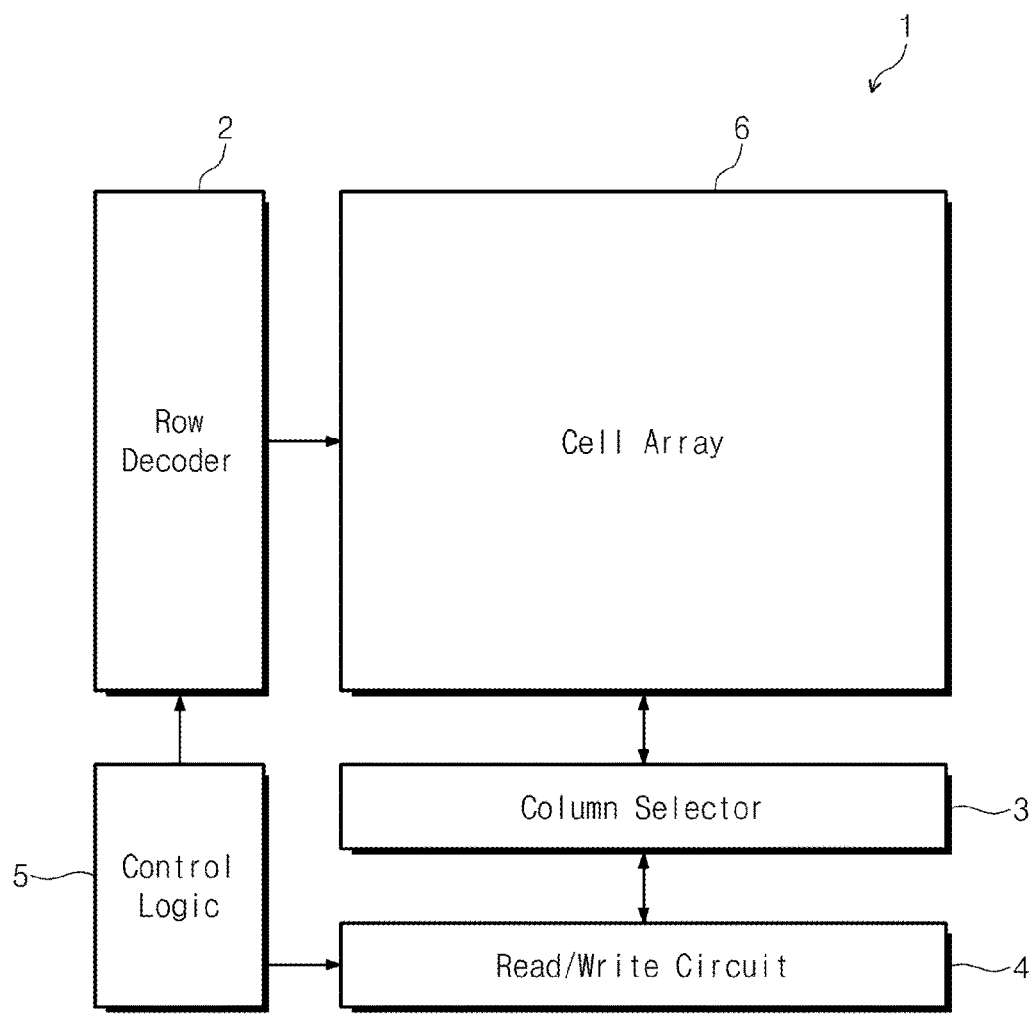
FIG. 1 is a schematic block diagram illustrating a magnetic memory device according to example embodiments of the inventive concepts.

It should be noted that these figures are intended to illustrate the general characteristics of methods, structure and/or materials utilized in certain example embodiments and to supplement the written description provided below. These drawings are not, however, to scale, and may not reflect the precise structural or performance characteristics of any given embodiment, and should therefore not be interpreted as defining or limiting the range of values or properties encompassed by the example embodiments or the inventive concepts. For example, the relative thicknesses and positioning of molecules, layers, regions and/or structural elements may be reduced or exaggerated for clarity. The use of similar or identical reference numbers in the various drawings is intended to indicate the presence of similar or identical elements or features.

DETAILED DESCRIPTION

Various embodiments of the inventive concepts will now be described more fully with reference to the accompanying drawings, in which example embodiments are shown. Embodiments of the inventive concepts may, however, be embodied in many different forms and should not be construed as being limited to the example embodiments set forth herein. Rather, these example embodiments are provided so that this disclosure will be thorough and complete, and will fully convey the inventive concepts to those of ordinary skill in the art. In the drawings, the thicknesses of layers and regions may be exaggerated for clarity. Like reference numerals in the drawings denote like elements, and thus redundant descriptions thereof may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a first element, component, region, layer and/or section discussed below could be termed a second element, component, region, layer and/or section without departing from the teachings of example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may also be otherwise oriented (e.g., rotated 90 degrees or at other orientations) and the spatially relative descriptors used herein interpreted accordingly.

The terminology used herein for the purpose of describing particular example embodiments is not intended to be limiting of the inventive concepts. As used herein, the singular forms "a", "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the inventive concepts should not be construed as limited to the particular shapes of regions illustrated herein, but are to include deviations in shapes that result, for example, from manufacturing. For example, an implanted region illustrated as a rectangle may have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, regions illustrated in the figures are schematic in nature and their shapes are not intended to illustrate the actual shape of a region of a device or to limit the scope of the inventive concepts.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two or more different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device. Three-dimensional arrays or matrices of devices may also be provided. Specifically, by replicating devices according to various embodiments described herein in a third direction (that may, for example, be orthogonal to the two different directions), a three-dimensional integrated circuit may be provided.

The devices according to various embodiments described herein may also be interspersed among other devices in the microelectronic device depending on the functionality of the microelectronic device.

Accordingly, the cross-sectional view(s) illustrated herein provide support for a plurality of devices constructed according to one or more of the various embodiments described herein that are arranged along two different directions when viewed in plan view and/or in three different directions when viewed in perspective view. For example, when a single active region is illustrated in a cross-sectional view of a device/structure, the overall device/structure may actually include a plurality of active regions and transistor structures (or memory cell structures, gate structures, etc., as appropriate to the case) thereon.

Unless otherwise defined, all terms (including technical and scientific terms) used herein have the same meaning as commonly understood by one of ordinary skill in the art to which the inventive concepts belong. It will be further understood that these terms, including those defined in commonly-used dictionaries, should be interpreted as having a meaning that is consistent with their meaning in the context of the relevant art and should not be interpreted in an idealized or overly formal sense unless expressly so defined herein.

FIG. 1 is a schematic block diagram of a magnetic memory device 1 according to example embodiments of the inventive concepts. And FIG. 2 is a schematic circuit diagram of a memory cell array 6 of the magnetic memory device 1 of FIG. 1, also according to example embodiments of the inventive concepts.

Figure 2:
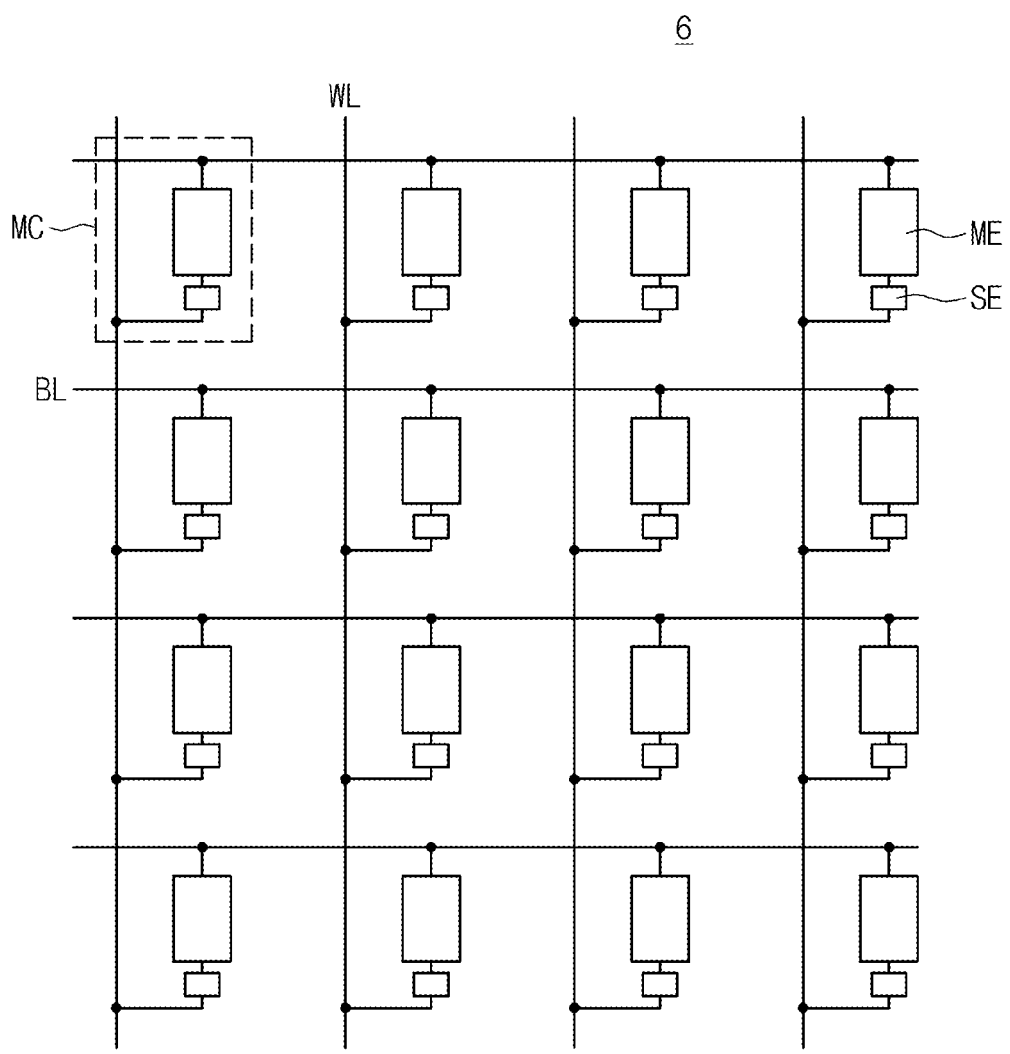
FIG. 2 is a schematic circuit diagram of a memory cell array of a magnetic memory device according to example embodiments of the inventive concepts.

Referring to FIGS. 1 and 2, a magnetic memory device 1 may include a memory cell array 6, a row decoder 2, a column selection circuit 3, a read and write circuit 4, and a control logic 5.

The memory cell array 6 may include a plurality of word lines WL, a plurality of bit lines BL, and a plurality of memory cells MC provided at intersections between the word lines and the bit lines. The row decoder 2 may be connected to the memory cell array 6 through the word lines WL. The row decoder 2 may be configured to decode address information input from the outside and thereby to select one of the word lines WL.

The column selection circuit 3 may be connected to the memory cell array 6 through the bit lines BL and may be configured to decode address information input from the outside and thereby to select one of the bit lines BL. The bit line BL selected by the column selection circuit 3 may be connected to the read and write circuit 4.

The read and write circuit 4 may provide a bit line bias for accessing the selected memory cell, in response to control signals from the control logic 5. Further, the read and write circuit 4 may provide a bit line voltage to the selected bit line BL for writing or reading data to or from the memory cell MC.

The control logic 5 may output control signals for controlling the semiconductor memory device, in response to command signals input from the outside. The control signals output from the control logic 5 may be used to control the read and write circuit 4.

As shown in FIG. 2, the memory cell array 6 may include a plurality of first conductive lines, a plurality of second conductive lines, and a plurality of unit memory cells MC. The first conductive lines may serve as the word lines WL, and the second conductive lines may serve as the bit lines BL. The unit memory cells MC may be two- or three-dimensionally provided. The word lines WL and the bit lines BL may intersect, and a unit memory cell MC may be provided at each of the intersections between the word lines WL and the bit lines BL. Each of the word lines WL may be connected to a plurality of the unit memory cells MC. Each of the bit lines BL may be connected to a corresponding one of the unit memory cells MC connected to a specific one of the word lines WL. Accordingly, the unit memory cells MC may be connected to the read and write circuit 4, described previously with reference to FIG. 1, through the bit lines BL.

Each of the unit memory cells MC may include a memory element ME and a selection element SE. The memory element ME may be provided between the bit line BL and the selection element SE, and the selection element SE may be provided between the memory element ME and the word line WL. The memory element ME may, for example, be a variable resistance device, whose resistance can be switched to one of at least two values, depending on an electric pulse applied thereto.

In example embodiments, the memory element ME may be formed in a layered structure, whose electric resistance can by changed by a spin transfer process using an electric current passing therethrough. For example, the memory element ME may have a layered structure configured to exhibit a magneto-resistance property, and may include at least one ferromagnetic material and/or at least one antiferromagnetic material. In example embodiments, the memory element ME may be a magnetic memory element with a magnetic tunnel junction MTJ.

The selection element SE may be configured to selectively control an electric current passing through the memory element ME. For example, the selection element SE may be a diode, a pnp bipolar transistor, an npn bipolar transistor, an NMOS (n-channel metal-oxide-semiconductor) field effect transistor (FET), or a PMOS (p-channel metal-oxide-semiconductor) FET. If the selection element SE is a three-terminal switching device (e.g., a bipolar transistor or a MOSFET), an additional interconnection line may be connected to a control electrode or gate of the selection element SE.

FIGS. 3 through 9 are sectional views of a memory cell MC of FIG. 2 during various stages of fabrication, illustrating a method of fabricating a magnetic memory device 1, according to example embodiments of the inventive concepts.

Referring to FIG. 3A, a substrate 10 may be provided. The substrate 10 may, for example, be a silicon substrate, a germanium substrate, and/or a silicon-germanium substrate. The substrate 10 may be formed to have at least one conductive region (not shown).

A lower interlayered insulating layer 20 may be formed on the substrate 10. The lower interlayered insulating layer 20 may be formed of, or include, at least one of oxides (e.g., silicon oxide), nitrides (e.g., silicon nitride), and/or oxynitrides (e.g., silicon oxynitride). A contact plug 22 may be formed in the lower interlayered insulating layer 20. The contact plug 22 may be connected to the conductive region (not shown). The contact plug 22 may be formed of, or include, doped semiconductor materials (e.g., doped silicon and so forth), metals (e.g., tungsten, aluminum, titanium, and/or tantalum), conductive metal nitrides (e.g., titanium nitride, tantalum nitride, and/or tungsten nitride), and/or metal-semiconductor compounds (e.g., metal silicides).

A lower electrode layer 31 may be formed on the lower interlayered insulating layer 20. The lower electrode layer 31 may overlap and be connected to the contact plug 22. The lower electrode layer 31 may be formed of, or include, at least one of conductive metal nitrides (e.g., titanium nitride and tantalum nitride), transition metals (e.g., titanium, tantalum, and so forth), and/or rare-earth metals (e.g., ruthenium, platinum, and so forth).

A lower magnetic layer 40 may be formed on the lower electrode layer 31. The lower magnetic layer 40 may have a fixed magnetization direction. An antiferromagnetic layer (not shown) may also be provided below the lower magnetic layer 40. The lower magnetic layer 40 may, for example, be a stacked structure (not shown), including a first ferromagnetic layer, an exchange coupling layer, and a second ferromagnetic layer, with the first ferromagnetic layer having a magnetization direction which is antiparallel (or opposite to) that of the second ferromagnetic layer.

In the lower magnetic layer 40, each of the first and second ferromagnetic layers may include a ferromagnetic material and may have a magnetization direction that is parallel to a top surface of the substrate 10. Each of the first and second ferromagnetic layers may be formed of, or include, at least one of cobalt-iron-boron (CoFeB), cobalt-iron (CoFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), and/or cobalt-iron-nickel (CoFeNi).

Alternatively, the first and second ferromagnetic layers may each have a magnetization direction which is substantially perpendicular to the top surface of the substrate 10. For example, at least one of the first and second ferromagnetic layers may include at least one of: perpendicular magnetic materials (e.g., CoFeTb, CoFeGd, CoFeDy), a perpendicular magnetic material having a $L1_0$ structure, and/or CoPt having a hexagonal close packed (HCP) lattice structure. The perpendicular magnetic material having the $L1_0$ structure may include at least one of $L1_0$-ordered FePt, $L1_0$-ordered FePd, $L1_0$-ordered CoPd, and/or $L1_0$-ordered CoPt. The exchange coupling layer may include at least one non-magnetic metallic element (e.g., including non-magnetic transition metals). For example, the exchange coupling layer may be formed of, or include, at least one of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and/or hafnium (Hf).

A tunnel barrier layer 42 may be formed on the lower magnetic layer 40. The tunnel barrier layer 42 may be formed of, or include, at least one of magnesium oxide, titanium oxide, aluminum oxide, magnesium-zinc oxide, and/or magnesium-boron oxide.

An upper magnetic layer 44 may be formed on the tunnel barrier layer 42. The upper magnetic layer 44 may be configured in such a way that a magnetization direction thereof can be switched using an external signal. The upper magnetic layer 44 may include a ferromagnetic material, and a magnetization direction thereof may be parallel to the top surface of the substrate 10. The upper magnetic layer 44 may include iron and cobalt. For example, the upper magnetic layer 44 may include at least one of cobalt-iron-boron (CoFeB), cobalt-iron (CoFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), and/or cobalt-iron-nickel (CoFeNi).

Alternatively, the upper magnetic layer 44 may have a magnetization direction that is substantially perpendicular to the top surface of the substrate 10. For example, the upper magnetic layer 44 may include at least one of: perpendicular magnetic materials (e.g., CoFeTb, CoFeGd, CoFeDy), a perpendicular magnetic material having a $L1_0$ structure, and/or CoPt having a hexagonal close packed (HCP) lattice structure. The perpendicular magnetic material having the $L1_0$ structure may include at least one of $L1_0$-ordered FePt, $L1_0$-ordered FePd, $L1_0$-ordered CoPd, and/or $L1_0$-ordered CoPt.

An interfacial layer 46 may be formed on the upper magnetic layer 44. The interfacial layer 46 may be formed of, or include, at least one of magnesium oxide, titanium oxide, aluminum oxide, magnesium-zinc oxide, and/or magnesium-boron oxide. Due to the presence of the interfacial layer 46, the upper magnetic layer 44 may have a magnetization direction perpendicular to the top surface of the substrate 10. In other words, the interfacial layer 46 may serve as an external element, allowing the upper magnetic layer 44 to have an interface-driven perpendicular magnetic anisotropy (i-PMA).

A capping layer 48 may be formed on the interfacial layer 46. The capping layer 48 may prevent an inter-diffusion between the magnetic layers 40 and 44 and an upper electrode layer 32, which is formed in a subsequent process. In certain embodiments, the capping layer 48 may further be provided between the lower magnetic layer 40 and the lower electrode layer 31. (See the capping layer 48a in FIG. 3B.) The capping layer 48 may be formed of or include at least one of, for example, Ru, Ta, Ti, and/or Pt.

An upper electrode layer 32 may be formed on the capping layer 48. The upper electrode layer 32 may be formed of, or include, at least one of conductive metal nitrides (e.g., titanium nitride and/or tantalum nitride), transition metals (e.g., titanium, tantalum, and so forth), and/or rare-earth metals (e.g., ruthenium, platinum, and so forth).

Figure 4:
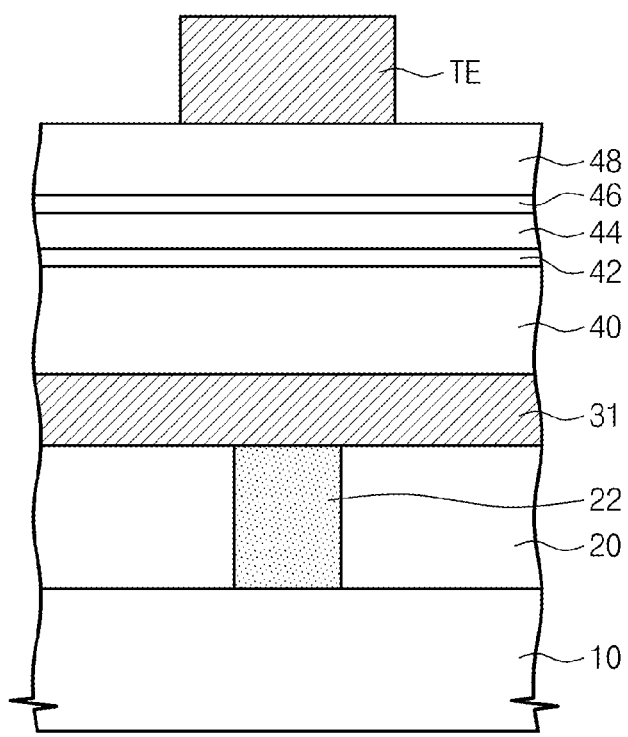
Figure 5:
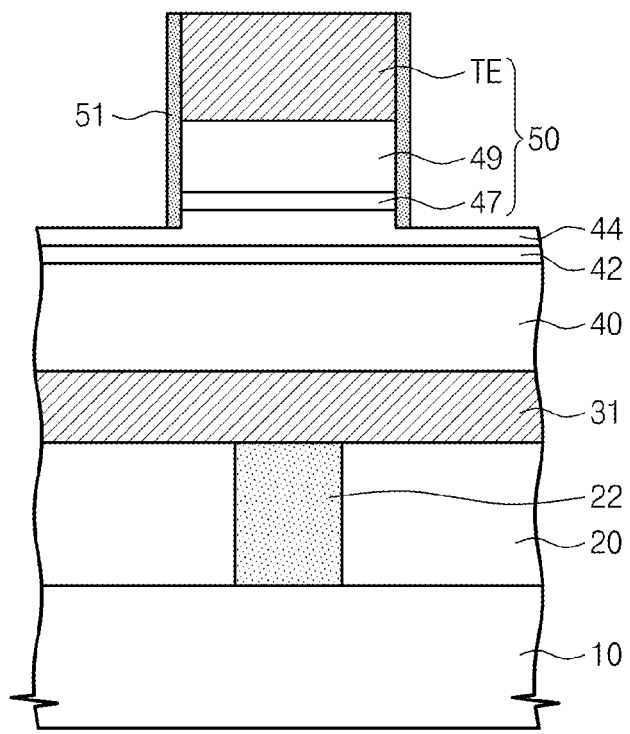

Referring to FIGS. 4 and 5, the upper electrode layer 32 may be patterned to form an upper electrode TE. In the patterning process, the capping layer 48 and the interfacial layer 46 may be etched to expose at least a portion of the upper magnetic layer 44. As a result of the patterning process, a capping pattern 49 and an interfacial pattern 47 may be formed below the upper electrode TE. The upper electrode TE, the capping pattern 49, and/or the interfacial pattern 47 may serve as a mask pattern 50 for patterning underlying layers. The mask pattern 50 may expose at least a portion of the upper magnetic layer 44. The exposed portion of the upper magnetic layer 44 may be partially, but not completely etched, so that the tunnel barrier layer 42 is not exposed.

As a result of the patterning process, a re-deposition spacer 51 may be formed on a sidewall of the mask pattern 50. The re-deposition spacer 51 may also be formed on at least a portion of a sidewall of the upper magnetic layer 44. For example, a polymer may be produced during the process of patterning the upper electrode TE, the capping pattern 49, and the interfacial pattern 47, and may be re-deposited on the sidewall of the mask pattern 50, thereby forming the re-deposition spacer 51. The re-deposition spacer 51 may include at least one of the materials constituting the upper electrode TE, the capping pattern 49, and/or the interfacial pattern 47.

Figure 6:
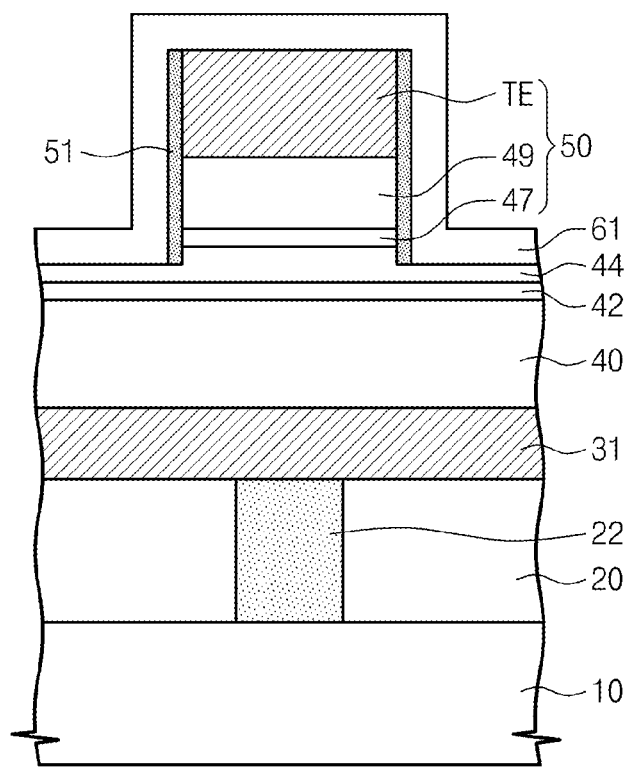

Referring to FIG. 6, a capping insulating layer 61 may be formed on the sidewall of the mask pattern 50 and a portion of the upper magnetic layer 44. The capping insulating layer 61 may be conformally formed using, for example, an atomic layer deposition (ALD) process. The capping insulating layer 61 may include at least one of silicon oxide and/or metal oxides (e.g., aluminum oxide). The capping insulating layer 61 may, for example, be formed to have a thickness ranging from about 30 Å to about 50 Å.

Figure 7:
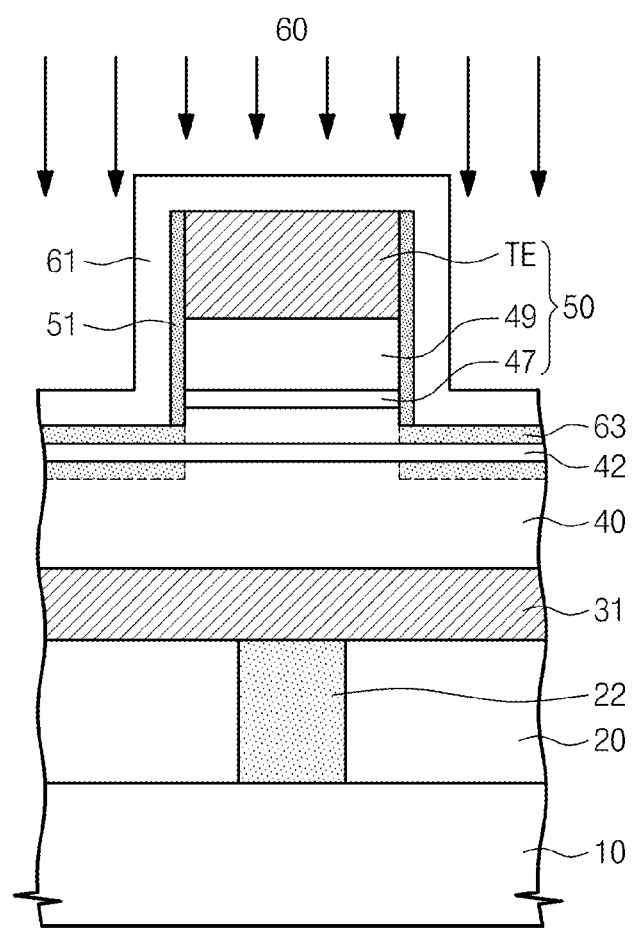

Referring to FIG. 7, oxygen ions 60 may be injected into portions of the upper magnetic layer 44 through the capping insulating layer 61, and may be thermally treated to form an oxide layer 63 in the upper magnetic layer 44. For example, the oxide layer 63 may include a metal oxide, formed by oxidizing the upper magnetic layer 44. The oxide layer 63 may extend to an upper portion of the lower electrode layer 40 beyond the tunnel barrier layer 42. The oxygen ions 60 may be plasma injected. Thermal treatment of the injected oxygen ions may be performed using an RTP process.

The oxygen ion injection process of FIG. 7 will now be more fully described with reference to FIGS. 10A and 10B, which illustrate the injection process being performed without and with the capping insulating layer 61, respectively. Oxygen plasma including an oxygen ion $O^+$ and an oxygen radical $O^*$ may be used in the oxygen ion injection process. A bias power of several to several tens kV may be used in the oxygen ion injection process. Such a bias power may allow oxygen ions $O^+$ to have a high energy and a good perpendicular directionality.

Figure 10A:
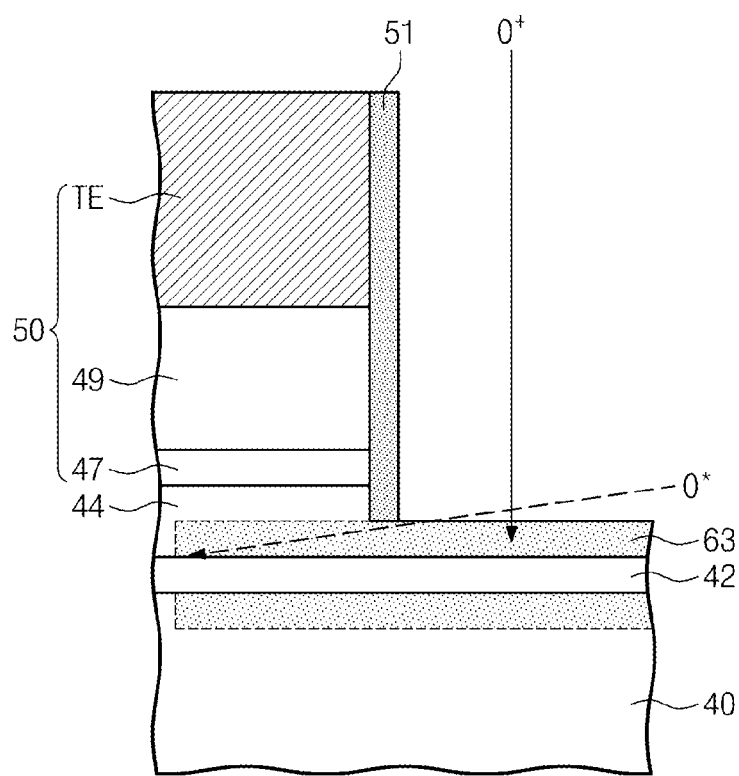
FIGS. 10A and 10B are sectional views of the magnetic memory device of FIG. 7, further illustrating an oxygen ion implantation process.

Referring to FIG. 10A, due to its high energy and good perpendicular directionality, the oxygen ions $O^+$ may be injected into a portion of the upper magnetic layer 44. For example, a propagation direction of the oxygen ions $O^+$ may be substantially restricted to a direction perpendicular to a top surface of the upper magnetic layer 44. Accordingly, it is possible to prevent the oxygen ions $O^+$ from being injected into a portion of the second magnetic layer 44 positioned below the mask pattern 50. By contrast, as illustrated by a dotted line, the oxygen radicals $O^*$ may have a low energy and a poor perpendicular directionality, and thus, the oxygen radicals $O^*$ may propagate along a direction which is at an angle or substantially parallel to the top surface of the upper magnetic layer 44. Accordingly, oxygen radicals $O^*$ may be injected into the portion of the upper magnetic layer 44 positioned below the mask pattern 50. The presence of oxygen radicals $O^*$ in the upper magnetic layer 44 may damage at least a portion of the upper magnetic layer 44.

Figure 10B:
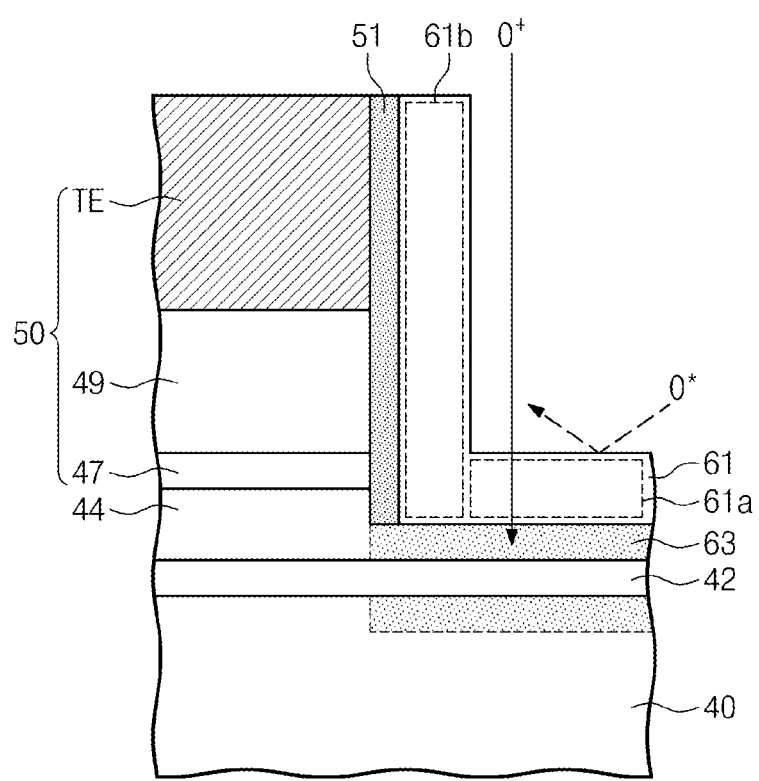

Referring to FIG. 10B, due to its high energy and good perpendicular directionality, the oxygen ions $O^+$ may penetrate a bottom portion 61a of the capping insulating layer 61 and be injected into a portion of the upper magnetic layer 44, which is located below the bottom portion 61a of the capping insulating layer 61. A propagation direction of the oxygen ions $O^+$ may be substantially restricted to a direction perpendicular to a top surface of the upper magnetic layer 44. Due to its good perpendicular directionality, the oxygen ions $O^+$ may not be permitted to penetrate the mask pattern 50, the re-deposition spacer 51, and a sidewall portion 61b of the capping insulating layer 61. Accordingly, the oxygen ions $O^+$ may be substantially prevented from being injected into a portion of the upper magnetic layer 44 below the mask pattern 50. During the thermal treatment process, some of the oxygen atoms in the upper magnetic layer 44 may be diffused from the oxygen-injected portion (for example, below the bottom portion 61a) toward other portions (for example, below the sidewall portion 61b).

In this embodiment, although a propagation direction of the oxygen radicals $O^*$ may be at an angle to the sidewall portion 61b, the capping insulating layer 61 may reflect the oxygen radicals $O^*$, thereby preventing the oxygen radicals $O^*$ from being injected into the upper magnetic layer 44. In other words, the capping insulating layer 61 may make it possible to prevent oxygen radicals $O^*$ with low energy and poor perpendicular directionality from being injected into the upper magnetic layer 44.

Table 1 (provided below) illustrates short rates, TMR values, and STT switching rates obtained in three different cases: (1) a reference case (Ref.) that uses only the conventional dry etching process, (2) the embodiment of FIG. 10A, and (3) the embodiment of FIG. 10B. As shown in Table 1, the short rates for the embodiments of FIGS. 10A and 10B were lower than that of the reference case, in which only the dry etching process was used. This demonstrates that the structures of FIGS. 10A and 10B are highly effective in preventing a short of the MTJ, which may otherwise result from the re-deposition spacer. This is because the re-deposition spacer is positioned on the upper magnetic layer 44. Table 1 also shows that there was no significant difference in TMR values between the reference case and the embodiments of FIGS. 10A and 10B.

As further illustrated in Table 1, the STT switching rate in the embodiment of FIG. 10A was much lower than that in the reference case. This may be because the process used in the embodiment of FIG. 10A may lead to damage to the second magnetic layer 44, as described above. By contrast, there was no significant difference in an STT switching rate between the case of FIG. 10B and the reference case. In other words, due to the presence of the capping insulating layer 61 (according to certain example embodiments of the inventive concepts), it is possible to prevent the upper magnetic layer 44 from being damaged during the oxygen ion implantation process.

TABLE 1

|  | Ref. (Etch Only) | FIG. 10A | FIG. 10B |
| --- | --- | --- | --- |
| Short Rate | 15-20% | less than 2% | less than 2% |
| TMR Value | — | similar to Ref. | similar to Ref. |
| STT Switching Rate | — | 20% of Ref. | similar to Ref. |

According to the afore-described embodiments, it is possible to realize a magnetic tunnel junction with better reliability, as compared to the case of using a conventional dry etching process. It is further possible to easily perform a patterning process for forming the magnetic tunnel junction, and an increased integration density of the magnetic memory device is therefore possible.

Figure 8:
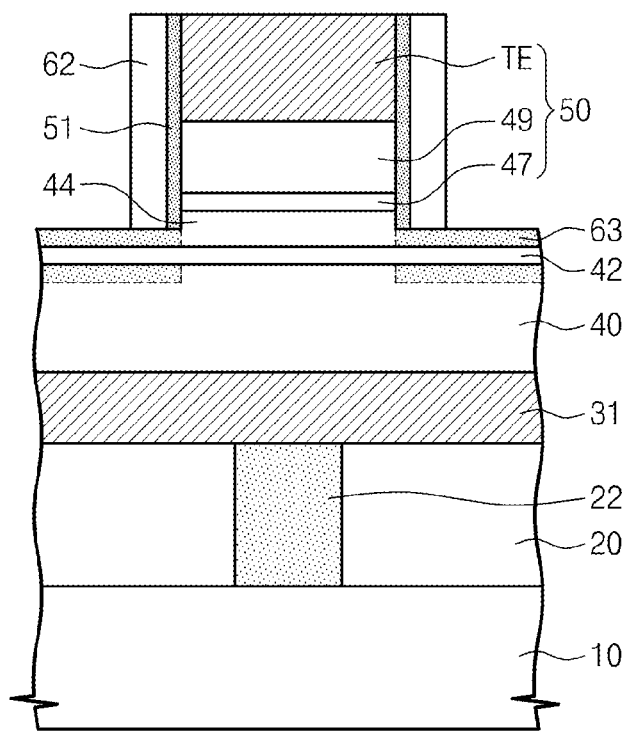
Figure 9:
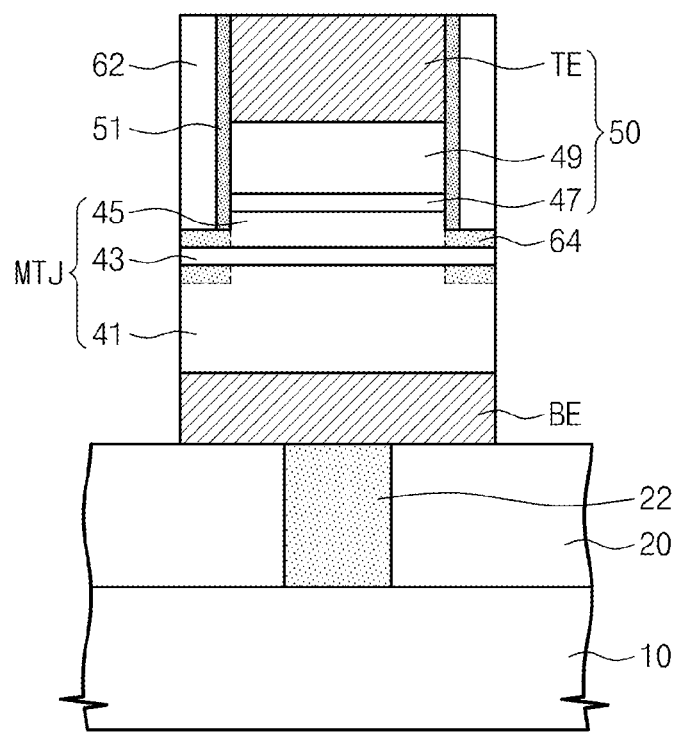

FIGS. 8 and 9 are sectional views of the memory cell MC illustrating the results of a further etching process for forming a capping spacer 62 on a sidewall of the mask pattern 50. Referring to FIGS. 8 and 9, the capping insulating layer 61 may be anisotropically etched to form a capping spacer 62 on a sidewall of the mask pattern 50. The oxide layer 63, the tunnel barrier layer 42, and the lower magnetic layer 40 may be patterned using the mask pattern 50 and the capping spacer 62 to form an upper magnetic pattern 45, an oxide pattern 64, a tunnel barrier pattern 43, and a lower magnetic pattern 41. The oxide pattern 64 may be a metal oxide pattern, which may be formed by oxidizing a metallic material of the upper magnetic pattern 45.

Thereafter, the lower electrode layer 31 may be patterned using the mask pattern 50 and the capping spacer 62 to form a lower electrode BE.

The magnetic memory device according to example embodiments of the inventive concepts will now be described in greater detail with reference to FIG. 9.

Referring specifically to FIG. 9, a lower interlayered insulating layer 20 may be provided on a substrate 10. A contact plug 22 may be formed in the lower interlayered insulating layer 20. The contact plug 22 may be connected to the conductive region (not shown). A lower electrode BE may be formed on the lower interlayered insulating layer 20. The lower electrode BE may overlap and be connected to the contact plug 22.

A magnetic tunnel junction MTJ may be provided on the lower electrode BE. The magnetic tunnel junction MTJ may include the lower magnetic pattern 41, the upper magnetic pattern 45 (provided on the lower magnetic pattern 41 and having a width that is smaller than that of the lower magnetic pattern 41), and the tunnel barrier pattern 43 (provided between the lower and upper magnetic patterns 41 and 45, respectively). The lower magnetic pattern 41 may have a switchable magnetization direction, and the upper magnetic pattern 45 may have a fixed magnetization direction.

The lower magnetic pattern 41 may include a first ferromagnetic layer, an exchange coupling layer, and a second ferromagnetic layer, which are sequentially stacked above the substrate 10. The first ferromagnetic layer may have a magnetization direction that is antiparallel (opposite) to that of the second ferromagnetic layer.

Each of the first and second ferromagnetic layers may include a ferromagnetic material and may have a magnetization direction that is parallel to the top surface of the substrate 10. Each of the first and second ferromagnetic layers may be formed of, or include, at least one of, cobalt-iron-boron (CoFeB), cobalt-iron (CoFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), and/or cobalt-iron-nickel (CoFeNi).

Alternatively, the first and second ferromagnetic layers may have a magnetization direction that is substantially perpendicular to the top surface of the substrate 10. For example, at least one of the first and second ferromagnetic layers may include at least one of: perpendicular magnetic materials (e.g., CoFeTb, CoFeGd, CoFeDy), a perpendicular magnetic material having a $L1_0$ structure, and/or CoPt having a hexagonal close packed (HCP) lattice structure. The perpendicular magnetic material having the $L1_0$ structure may include at least one of $L1_0$-ordered FePt, $L1_0$-ordered FePd, $L1_0$-ordered CoPd, and/or $L1_0$-ordered CoPt. The exchange coupling layer may include at least one non-magnetic metallic elements (e.g., including non-magnetic transition metals). For example, the exchange coupling layer may be formed of, or include, at least one of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and/or hafnium (Hf).

The tunnel barrier pattern 43 may be formed of, or include, at least one of magnesium oxide, titanium oxide, aluminum oxide, magnesium-zinc oxide, and/or magnesium-boron oxide.

The upper magnetic pattern 45 may be configured in such a way that a magnetization direction thereof can be switched using an external signal. The upper magnetic pattern 45 may include at least one ferromagnetic material, and a magnetization direction thereof may be parallel to the top surface of the substrate 10. The upper magnetic pattern 45 may include iron and cobalt. The upper magnetic layer 44 may, for example, include at least one of cobalt-iron-boron (CoFeB), cobalt-iron (CoFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), and/or cobalt-iron-nickel (CoFeNi). Alternatively, the upper magnetic pattern 45 may have a magnetization direction that is substantially perpendicular to the top surface of the substrate 10. For example, the upper magnetic pattern 45 may include at least one of: perpendicular magnetic materials (e.g., CoFeTb, CoFeGd, CoFeDy), a perpendicular magnetic material having a $L1_0$ structure, and/or CoPt having a hexagonal close packed (HCP) lattice structure. The perpendicular magnetic material having the $L1_0$ structure may include at least one of $L1_0$-ordered FePt, $L1_0$-ordered FePd, $L1_0$-ordered CoPd, and/or $L1_0$-ordered CoPt.

An interfacial pattern 47 and a capping pattern 49 may be provided on the magnetic tunnel junction MTJ. The interfacial pattern 47 may be formed of, or include, at least one of magnesium oxide, titanium oxide, aluminum oxide, magnesium-zinc oxide, and/or magnesium-boron oxide. The interfacial pattern 47 may induce the upper magnetic pattern 45 to have a magnetization direction that is perpendicular to the top surface of the substrate 10. In other words, the interfacial pattern 47 may serve as an external element, allowing the upper magnetic pattern 45 to have an interface-driven perpendicular magnetic anisotropy (i-PMA). The capping pattern 49 may prevent inter-diffusion between the magnetic patterns 41 and 45 and an upper electrode TE. In certain embodiments, a capping pattern 49 may be further provided between the lower magnetic layer 40 and the lower electrode BE to prevent inter-diffusion therebetween. The capping pattern 49 may be formed of, or include, at least one of, for example, Ru, Ta, Ti, and/or Pt.

The upper electrode TE may be provided on the capping pattern 49. The upper electrode TE may be formed of, or include, at least one of conductive metal nitrides (e.g., titanium nitride and/or tantalum nitride), transition metals (e.g., titanium, tantalum, and so forth), and/or rare-earth metals (e.g., ruthenium, platinum, and so forth).

A capping spacer 62 may be provided on sidewalls of the upper electrode TE and the capping pattern 49. The capping spacer 62 may be formed of, or include, at least one of silicon oxide and/or metal oxides (e.g., aluminum oxide). The capping spacer 62 may, for example, be formed to have a thickness ranging from about 30 Å to about 50 Å.

A re-deposition spacer 51 may be provided between the upper electrode TE and the capping spacer 62 and between the capping pattern 49 and the capping spacer 62. The re-deposition spacer 51 may contain a material that is the same as at least one of the materials in the upper magnetic pattern 45, the capping pattern 49, and the upper electrode TE. The oxide pattern 64 may be configured to extend laterally from the upper magnetic pattern 45 and may be interposed between the capping spacer 62 and the tunnel bather pattern 43. The oxide pattern 64 may contain a material that is the same as a material of the upper magnetic pattern 45. For example, the oxide pattern 64 may be a metal oxide pattern formed by oxidizing the upper magnetic pattern 45. The oxide pattern 64 may extend to an upper portion of the lower magnetic pattern 41 beyond the tunnel bather pattern 43.

The tunnel bather pattern 43 and the lower magnetic pattern 41 may be formed having sidewalls that are self-aligned with a sidewall of the capping spacer 62. Further, a difference in width between the lower and upper magnetic patterns 41 and 45 may be larger than, or equal to, a width of the capping spacer 62. A bottom surface of the capping spacer 62 may be in contact with a top surface of the oxide pattern 64.

Figure 11A:
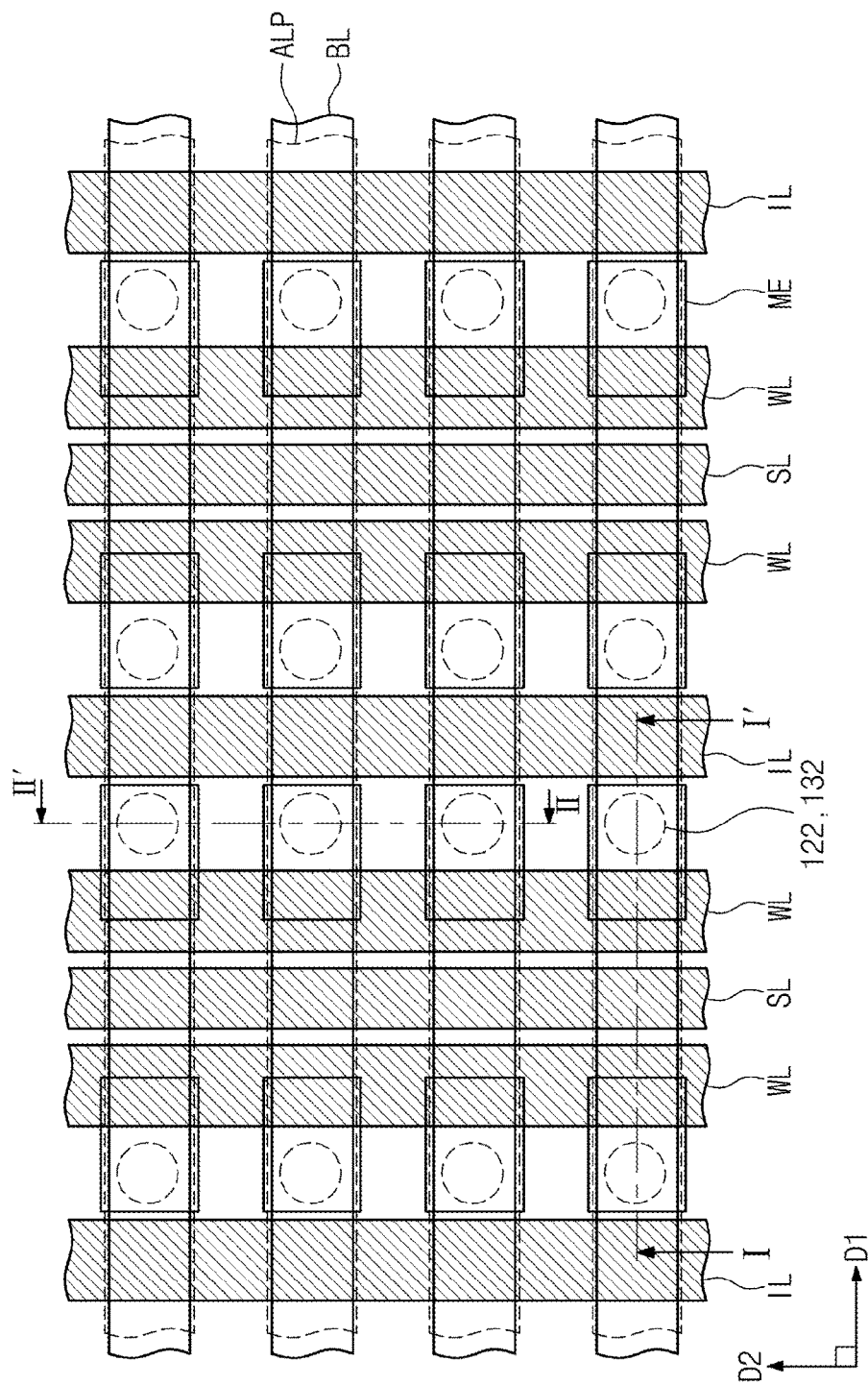
FIG. 11A is a plan view of a magnetic memory device according to example embodiments of the inventive concepts.
Figure 11B:
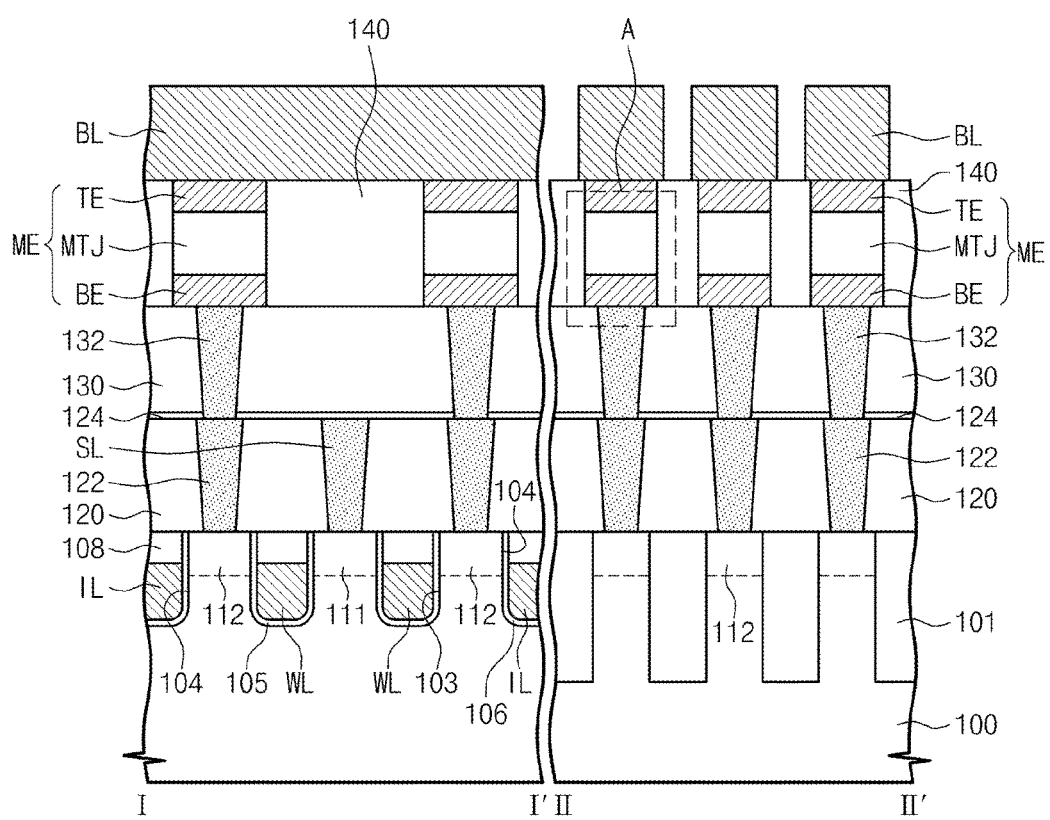
FIG. 11B is a sectional view of the magnetic memory device taken along lines I-I' and II-II' of FIG. 11A.

FIG. 11A is a plan view illustrating a magnetic memory device according to example embodiments of the inventive concepts, and FIG. 11B is a sectional view taken along lines I-I' and II-II' of FIG. 11A.

Referring to FIGS. 11A and 11B, a substrate 100 may be provided. The substrate 100 may, for example, be a silicon substrate, a germanium substrate, and/or a silicon-germanium substrate. The substrate 100 may be prepared to have a first conductivity type. Device isolation patterns 101 may be formed on the substrate 100. The device isolation patterns 101 may define active line patterns ALP. As shown in FIG. 11A, when viewed in plan view, each of the active line patterns ALP may be a substantially straight line-shaped pattern extending parallel to a first direction D1. The device isolation patterns 101 and the active line patterns ALP may be alternatingly arranged in a second direction D2 that is perpendicular to the first direction D1. In certain embodiments, the active line patterns ALP may be doped to have the first conductivity type.

The substrate 100 may include isolation recess regions 104 that are provided to cross (intersect) the active line patterns ALP and the device isolation patterns 101. When viewed in plan view, each of the isolation recess regions 104 may be shaped like a groove and may extend parallel to the second direction D2. The isolation recess regions 104 may divide each of the active line patterns ALP into a plurality of active patterns CA. Each of the active patterns CA may be a portion of a corresponding active line pattern ALP between an adjacent pair of the isolation recess regions 104. In other words, each of the active patterns CA may be defined by an adjacent pair of the device isolation patterns 101 and an adjacent pair of the isolation recess regions 104. When viewed in plan view, the active patterns CA may be disposed spaced apart from each other in both the first and second directions to form a matrix-shaped arrangement.

Gate recess regions 103 may be arranged along the second direction D2 to cross the active patterns CA. Each of the gate recess regions 103 may be shaped like a groove and may extend parallel to the isolation recess regions 104. In example embodiments, a pair of the gate recess regions 103 may cross each of the active patterns CA. In this case, a pair of cell transistors may be formed on each of the active patterns CA.

The gate recess regions 103 may have substantially the same depth as the isolation recess regions 104. A width of each of the gate recess regions 103 may be substantially equal to, or may be different from, that of the isolation recess regions 104. The depth of the gate and isolation recess regions 103 and 104 may be smaller than depths of the device isolation patterns 101.

Word lines WL may be provided in the gate recess regions 103, respectively. A gate dielectric layer 105 may be provided between the word line WL and the gate recess region 103. Due to the shape of the gate recess region 103, the word line WL may be a substantially straight line-shape structure extending parallel to the second direction D2. Each cell transistor may include the word line WL and a channel region, wherein the channel region has a recessed profile and faces the word line WL.

Isolation lines IL may be provided in the isolation recess regions 104, respectively. An isolation gate dielectric layer 106 may be provided between the isolation line IL and the isolation recess region 104. The isolation line IL may be a substantially straight line-shape structure extending parallel to the second direction D2.

A gate mask pattern 108 may be provided on each of the word and isolation lines WL and IL, respectively. The word and isolation lines WL and IL, respectively, may have top surfaces lower than the top entrances of the cell and isolation recess regions 103 and 104, respectively. The gate mask pattern 108 may be provided in an upper portion of each of the cell and isolation recess regions 103 and 104, respectively. The gate mask pattern 108 may have a top surface that is substantially coplanar with that of the substrate 100.

In operation of the magnetic memory device, an isolation voltage may be applied to the isolation lines IL. The isolation voltage may be selected to prevent a channel or inversion layer from being formed below the isolation recess regions 104. In other words, when the isolation lines IL are supplied with the isolation voltage, isolation channel regions positioned below the isolation lines IL may be turned-off. Accordingly, the active patterns CA of each active line pattern ALP may be electrically separated from each other. For example, when the active line patterns ALP are doped with p-type dopants, the isolation voltage may be a ground or negative voltage.

The word line WL may be formed of or include at least one of doped semiconductor materials (e.g., doped silicon and so forth), metals (e.g., tungsten, aluminum, titanium, and/or tantalum), conductive metal nitrides (e.g., titanium nitride, tantalum nitride, and/or tungsten nitride), and/or metal-semiconductor compounds (e.g., metal silicide). In example embodiments, the isolation line IL may be formed of the same material as the word line WL. The cell and isolation gate dielectric layers 105 and 106 may be formed of, or include, for example, silicon oxide, silicon nitride, silicon oxynitride, and/or high-k dielectric materials including insulating metal oxides (e.g., hafnium oxide and/or aluminum oxide). The gate mask pattern 108 may include, for example, silicon oxide, silicon nitride, and/or silicon oxynitride.

A first doped region 111 may be provided in each of the active patterns CA and between word lines WL in each adjacent pair of the word lines WL. Second doped regions 112 may be provided in the active patterns CA and between the word and isolation lines WL and IL, respectively. In example embodiments, the first doped region 111 may be provided in a central region of each of the active patterns CA, and a pair of the second doped regions 112 may be respectively provided in edge regions of each of the active patterns CA. Accordingly, a pair of cell transistors formed on each active pattern CA may share the first doped region 111. The first and second doped regions 111 and 112, respectively, may serve as source and drain regions of the cell transistor. The first and second doped regions 111 and 112, respectively, may be doped to have a second conductivity type different from the first conductivity type. One of the first and second conductivity types may be an n-type, and the other may be a p-type.

Further, a first interlayered insulating layer 120 may be provided on the substrate 100. The first interlayered insulating layer 120 may be formed of, or include, for example, silicon oxide. The first interlayered insulating layer 120 may be formed to have source grooves, and source lines SL may be provided to fill the source grooves, respectively. The source lines SL may extend parallel to the second direction D2. Each source line SL may be formed of or include at least one of doped semiconductor materials (e.g., doped silicon and so forth), metals (e.g., tungsten, aluminum, titanium, and/or tantalum), conductive metal nitrides (e.g., titanium nitride, tantalum nitride, and/or tungsten nitride), and/or metal-semiconductor compounds (e.g., metal silicide). Each source line SL may connect the first doped regions 111, which are arranged in the second direction D2, to each other. Further, the first interlayered insulating layer 120 may be formed to have first contact holes, and first contact plugs 122 may be respectively provided in the first contact holes and may be respectively connected to the second doped regions 112. The first contact plugs 122 may be formed of the same conductive material as the source lines SL. The source lines SL and the first contact plugs 122 may have top surfaces that are substantially coplanar with that of the first interlayered insulating layer 120.

An etch stop layer 124 may be provided on the first interlayered insulating layer 120. The etch stop layer 124 may be formed to cover the top surfaces of the source lines SL. The etch stop layer 124 may be formed of an insulating material having an etch selectivity with respect to the first interlayered insulating layer 120. For example, the first interlayered insulating layer 120 may be formed of silicon oxide, and the etch stop layer 124 may be formed of silicon nitride and/or silicon oxynitride.

The second interlayered insulating layer 130 may be provided on the etch stop layer 124. The second interlayered insulating layer 130 may be formed of silicon oxide.

Second contact plugs 132 may be provided to penetrate both of the second interlayered insulating layer 130 and the etch stop layer 124. The second contact plugs 132 may be electrically connected to the second doped regions 112, respectively, via the first contact plugs 122. In example embodiments, ohmic patterns (not shown) may be provided between the first and second contact plugs 122 and 132, between the first contact plugs 122 and the second doped regions 112, and between the source lines SL and the first doped regions 111. The ohmic pattern may be formed of, or include, at least one metal-semiconductor compound including a metal silicide (e.g., cobalt silicide and/or titanium silicide).

Figure 11C:
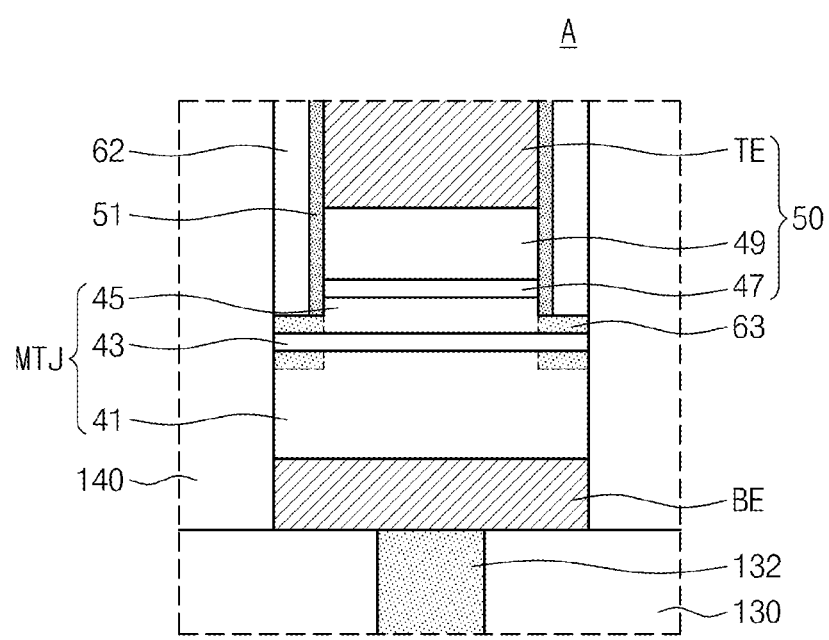
FIG. 11C is an enlarged view of a portion A of the magnetic memory device of FIG. 11B.

A plurality of memory elements ME may be provided on the second interlayered insulating layer 130. Each of the memory elements ME may include a lower electrode BE, a magnetic tunnel junction MTJ, and an upper electrode TE. The magnetic tunnel junction MTJ may, for example, have a structure such as that of FIG. 11C, which is an enlarged view (similar to FIG. 9) illustrating a portion A of FIG. 11B. The magnetic tunnel junction MTJ may have the same structure as that of FIG. 9, and thus, a detailed description thereof will be omitted.

Each of the memory elements ME may, for example, be patterned to have an island-shaped structure. When viewed in a plan view, the memory elements ME may each overlap corresponding ones of the second contact plugs 132.

A third interlayered insulating layer 140 may be formed on the second interlayered insulating layer 130 to be in contact with sidewalls of the memory elements ME. The third interlayered insulating layer 140 may be formed to expose the top surfaces of the memory elements ME.

Bit lines BL may be provided on the third interlayered insulating layer 140. The bit lines BL may extend in the first direction D1. Each of the bit lines BL may be in common contact with a plurality of the memory elements ME arranged in the first direction D1. For example, the bit line BL may be connected to the memory elements ME without any contact plug interposed therebetween. This makes it possible to simplify the fabrication process and reduce contact resistance between the bit line BL and the memory elements ME. Further, it is possible to improve uniformity in contact resistance between the bit line BL and the memory elements ME.

FIGS. 12A through 12D are sectional views of the magnetic memory device of FIG. 11A during various stages of fabrication, taken along lines I-I' and II-II', which further illustrate a method of fabricating a magnetic memory device according to example embodiments of the inventive concepts.

Figure 12A:
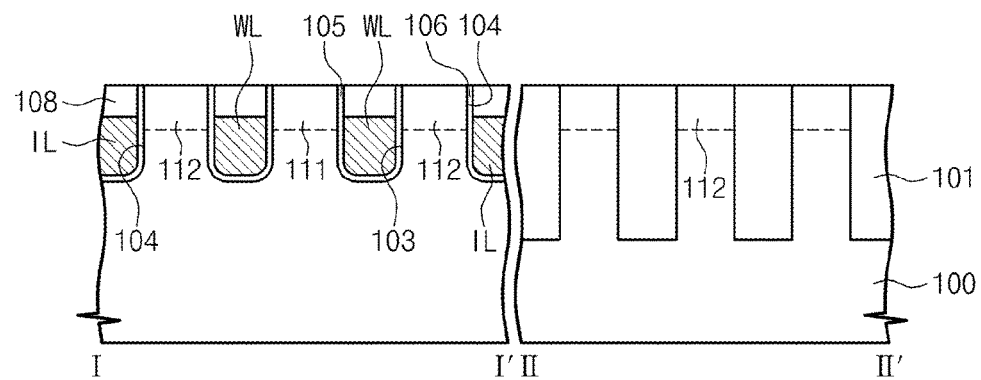
FIGS. 12A through 12D are sectional views of the magnetic memory device taken along lines I-I' and II-II' of FIG. 11A to further illustrate a method of fabricating a magnetic memory device according to example embodiments of the inventive concepts.

Referring to FIGS. 11A and 12A, the substrate 100 may be prepared. The substrate 100 may, for example, be a silicon substrate, a germanium substrate, and/or a silicon-germanium substrate. The substrate 100 may have the first conductivity type.

The device isolation patterns 101 may be formed on the substrate 100 to define the active line patterns ALP. The active line patterns ALP may be formed parallel to the first direction D1 of FIG. 11A. The device isolation patterns 101 may be formed using a shallow trench isolation (STI) process.

The active line patterns ALP and the device isolation patterns 101 may be patterned to form the gate and isolation recess regions 103 and 104 extending parallel to the second direction D2 of FIG. 11A. The isolation recess regions 104 may be formed to divide each active line pattern ALP into a plurality of active patterns CA. The gate recess regions 103 may cross (intersect) the cell active patterns CA. The gate and isolation recess regions 103 and 104 may be formed to have depths that are smaller than those of the device isolation patterns 101.

The cell gate dielectric layer 105 may be formed to conformally cover an inner surface of each gate recess region 103. The isolation gate dielectric layer 106 may also be formed to conformally cover an inner surface of each isolation recess region 104. In example embodiments, the cell and isolation gate dielectric layers 105 and 106, respectively, may be simultaneously formed using the same process. The cell and isolation gate dielectric layers 105 and 106, respectively, may be silicon oxide layers, which are formed by performing a thermal oxidation process on the substrate 100. Alternatively, the cell and isolation gate dielectric layers 105 and 106, respectively, may be formed of, or include, at least one of silicon oxide, silicon nitride, silicon oxynitride, and/or high-k dielectric materials including insulating metal oxides (e.g., hafnium oxide and/or aluminum oxide).

Next, a first conductive layer may be formed to fill the gate and isolation recess regions 103 and 104, respectively. The first conductive layer may be formed of, or include, at least one of doped semiconductor materials (e.g., doped silicon and so forth), metals (e.g., tungsten, aluminum, titanium, and/or tantalum), conductive metal nitrides (e.g., titanium nitride, tantalum nitride, and/or tungsten nitride), and/or metal-semiconductor compounds (e.g., metal silicide). The first conductive layer may be etched to form the word line WL in each gate recess region 103, and the isolation line IL in each isolation recess region 104. The word and isolation lines WL and IL, respectively, may be recessed to have top surfaces that are lower than that of the substrate 100.

The gate mask patterns 108 may be formed on the word and isolation lines WL and IL, respectively, to fill the gate and isolation recess regions 103 and 104, respectively, provided with the word and isolation lines WL and IL, respectively. The gate mask pattern 108 may be formed of or include at least one of silicon oxide, silicon nitride, and/or silicon oxynitride.

Dopants may be injected into the cell active patterns CA between the word lines WL to form the first and second doped regions 111 and 112, respectively, with the second conductivity type. Bottom surfaces of the first and second doped regions 111 and 112, respectively, may be formed at a level higher than bottom levels of the word and isolation lines WL and IL, respectively.

Figure 12B:
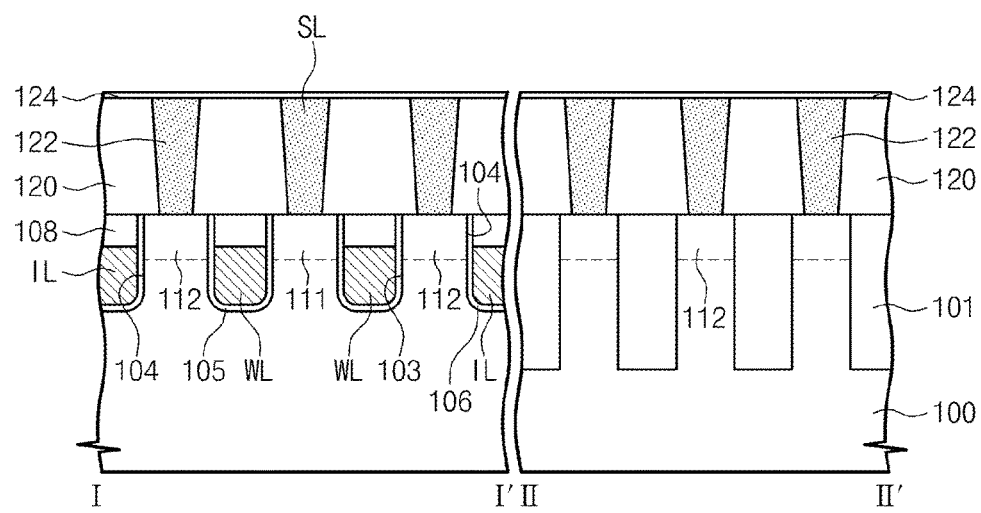

Referring to FIGS. 11A and 12B, the first interlayered insulating layer 120 may be formed on the substrate 100. The first interlayered insulating layer 120 may be formed of silicon oxide. The first interlayered insulating layer 120 may be patterned to form cell holes and source grooves.

A second conductive layer may be formed to fill the cell holes and the source grooves. The second conductive layer may be formed of, or include, at least one of doped semiconductor materials (e.g., doped silicon and so forth), metals (e.g., tungsten, aluminum, titanium, and/or tantalum), conductive metal nitrides (e.g., titanium nitride, tantalum nitride, and/or tungsten nitride), and/or metal-semiconductor compounds (e.g., metal silicide). A planarization process may be performed on the second conductive layer until the second interlayered insulating layer 120 is exposed. Accordingly, first contact plugs 122 may be formed in respective ones of the cell holes, and the source lines SL may be respectively formed in the source grooves. The first contact plugs 122 may be respectively connected to the second doped regions 112, and the source lines SL may be respectively connected to the first doped regions 111. In example embodiments, ohmic patterns (not shown) may be formed between the source lines SL and the first doped regions 111 and between the first contact plugs 122 and the second doped regions 112. The ohmic patterns may be formed of, or include, at least one of metal-semiconductor compounds including a metal silicide (e.g., cobalt silicide and/or titanium silicide).

Thereafter, the capping insulating layer 124 may be formed on the first interlayered insulating layer 120, the first contact plugs 122, and the source lines SL. The capping insulating layer 124 may be formed of, or include, silicon nitride and/or silicon oxynitride.

Figure 12C:
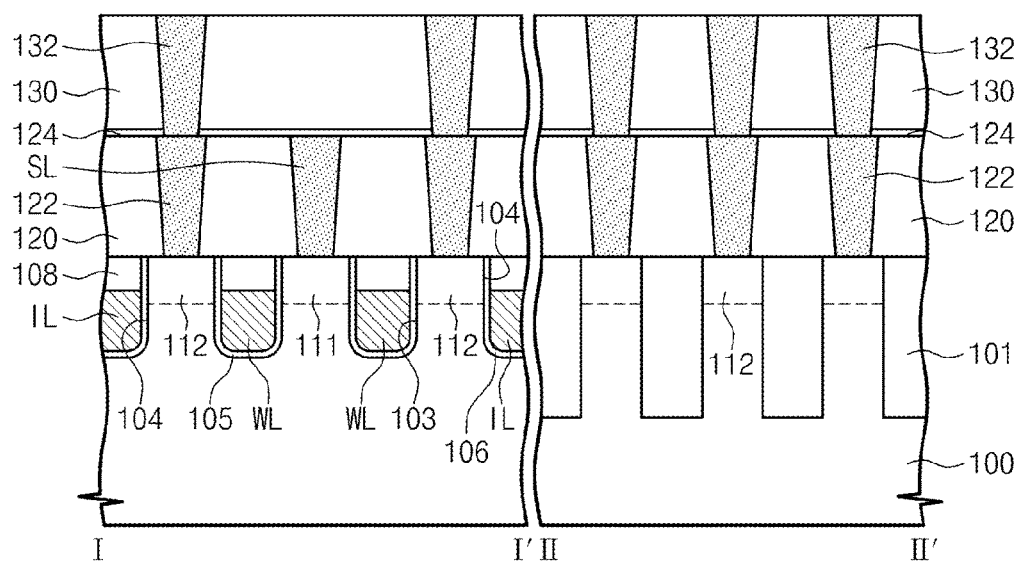

Referring to FIGS. 11A and 12C, the second interlayered insulating layer 130 may be formed on the capping insulating layer 124. The second interlayered insulating layer 130 may be formed of silicon oxide. The second contact plugs 132 may be formed to penetrate both of the second interlayered insulating layer 130 and the capping insulating layer 124. The second contact plugs 132 may be formed by the same method as, and of the same material as, the first contact plugs 122. The second contact plugs 132 may be electrically connected to respective ones of the second doped regions 112 through the first contact plugs 122. In example embodiments, ohmic patterns (not shown) may be formed between the second contact plugs 132 and the first contact plugs 122. The ohmic patterns may be formed of, or include, at least one of metal-semiconductor compounds including a metal silicide (e.g., cobalt silicide and/or titanium silicide).

Figure 12D:
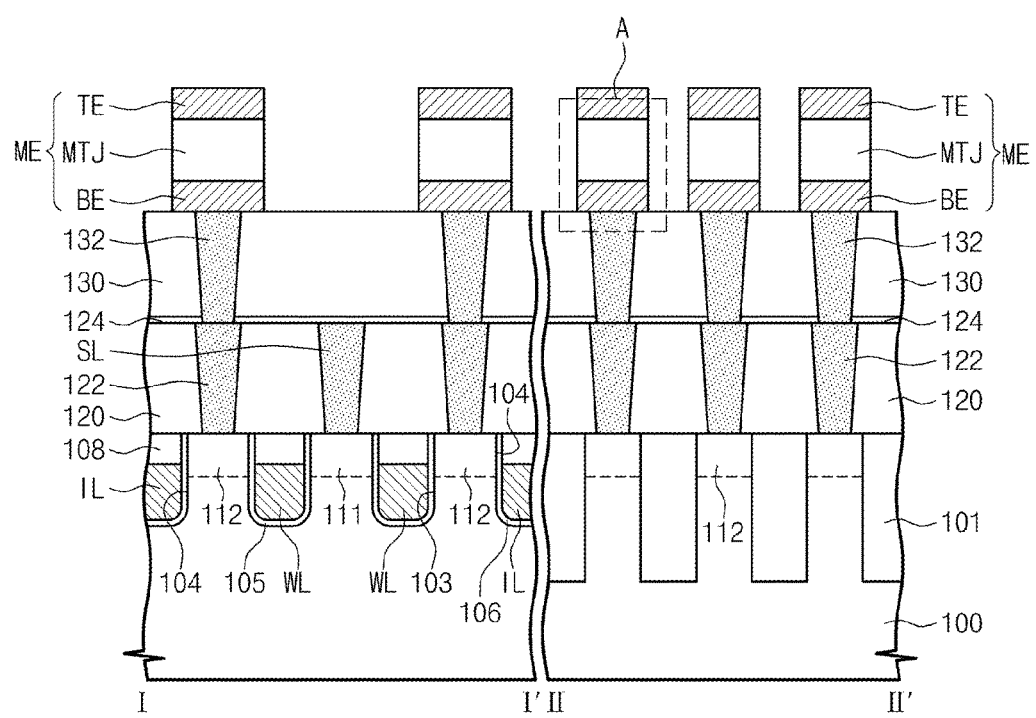

Referring to FIGS. 11A and 12D, a plurality of memory elements ME may be formed on the second interlayered insulating layer 130. Each of the memory elements ME may include a lower electrode BE, a magnetic tunnel junction MTJ, and an upper electrode TE. For example, each of the memory elements ME may be formed using a method such as that described previously with reference to FIGS. 3 through 9 or FIGS. 10A and 10B. As an example, each of the memory elements ME may be patterned to have an island-shaped structure. When viewed in a plan view, the memory elements ME may overlap corresponding ones of the second contact plugs 132.

Referring back to FIGS. 11A and 11B, the third interlayered insulating layer 140 may be formed on the second interlayered insulating layer 130 to be in contact with the sidewalls of the memory elements ME. The third interlayered insulating layer 140 may be formed to expose the top surfaces of the memory elements ME.

The bit lines BL may be provided on the third interlayered insulating layer 140. The bit lines BL may extend in the first direction D1. Each of the bit lines BL may be connected in common to a plurality of the memory elements ME arranged along the first direction D1.

Figure 13:
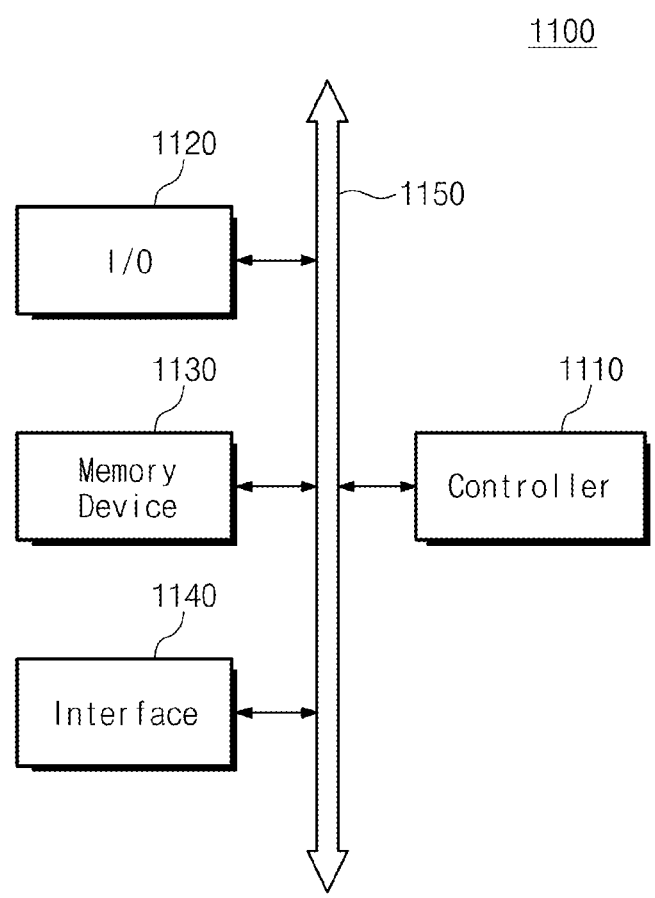
FIG. 13 is a schematic block diagram illustrating an electronic system including a magnetic memory device according to example embodiments of the inventive concepts.

FIG. 13 is a schematic block diagram illustrating an example of an electronic system that may include a semiconductor memory device constructed according to example embodiments of the inventive concepts.

Referring to FIG. 13, an electronic system 1100 may include a controller 1110, an input/output (I/O) unit 1120, a memory device 1130, an interface unit 1140 and a data bus 1150. At least two of the controller 1110, the I/O unit 1120, the memory device 1130, and the interface unit 1140 may communicate with each other via the data bus 1150. The data bus 1150 may correspond to a path through which electrical signals are transmitted. The memory device 1130 may be configured to include one or more magnetic memory devices according to example embodiments of the inventive concepts.

The controller 1110 may include at least one of a microprocessor, a digital signal processor, a microcontroller and/or another logic device. The other logic device may have a similar function to any one of the microprocessor, the digital signal processor and/or the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate wirelessly and/or by cable. For example, the interface unit 1140 may include an antenna for wireless communication and/or a transceiver for wired communication. The electronic system 1100 may further include a fast DRAM device and/or a fast SRAM device that acts as a cache memory for improving an operation of the controller 1110.

The electronic system 1100 may be implemented in a personal digital assistant (PDA), a portable computer, a web tablet, a wireless phone, a mobile phone, a digital music player, a memory card and/or an electronic product. The electronic product may receive and/or transmit information data wirelessly.

Figure 14:
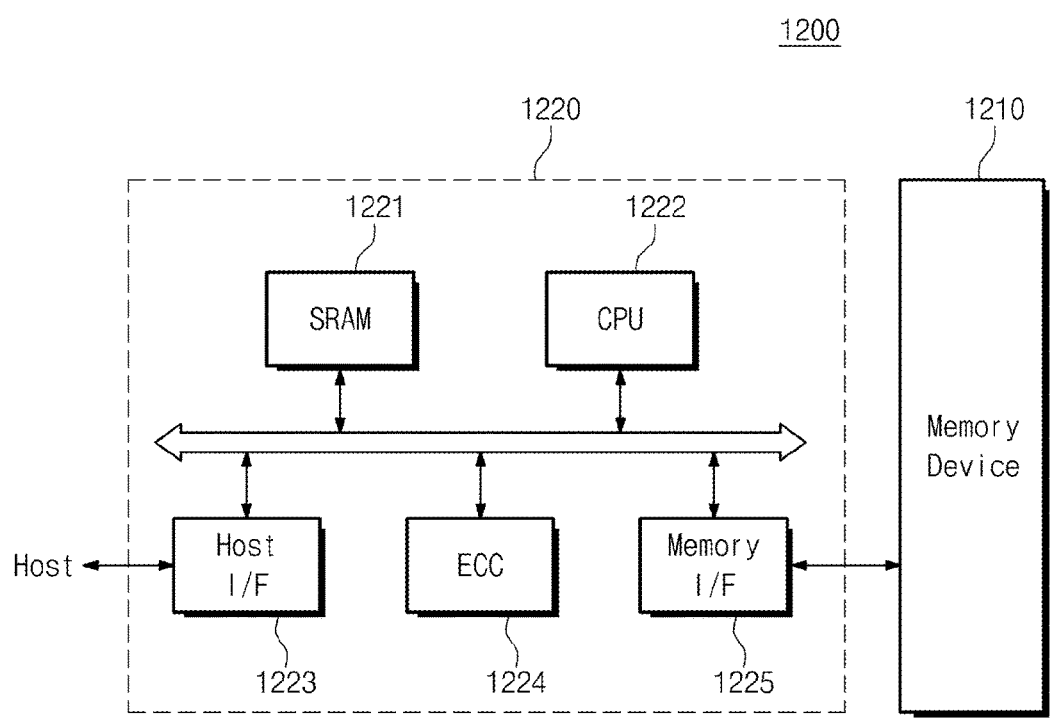
FIG. 14 is a schematic block diagram illustrating a memory card including a magnetic memory device according to example embodiments of the inventive concepts.

FIG. 14 is a schematic block diagram illustrating a memory card including a semiconductor memory device according to example embodiments of the inventive concepts.

Referring to FIG. 14, a memory card 1200 may include a memory device 1210. The memory device 1210 may include at least one magnetic memory device according to the afore-described embodiments of the inventive concepts. In other embodiments, the memory device 1210 may further include at least one memory device that is different from the memory devices according to the afore-described embodiments of the inventive concepts. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit 1222 that controls overall operations of the memory card 1200. In addition, the memory controller 1220 may include an SRAM device 1221 used as an operation memory of the central processing unit 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

Figure 15:
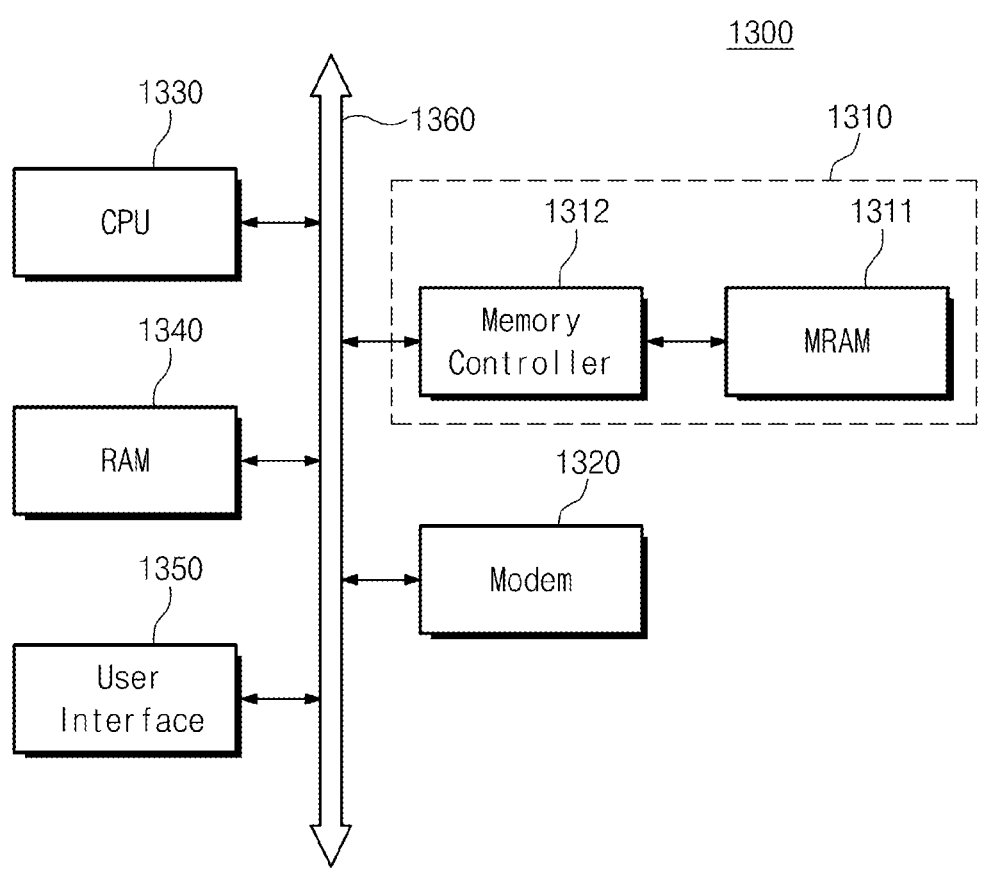
FIG. 15 is a schematic block diagram illustrating an information processing system including a magnetic memory device according to example embodiments of the inventive concepts.

FIG. 15 is a schematic block diagram illustrating an information processing system including a magnetic memory device according to example embodiments of the inventive concepts.

Referring to FIG. 15, an information processing system 1300 may include a memory system 1310 having at least one of the magnetic memory devices according to example embodiments of the inventive concepts. The information processing system 1300 may also include a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may constitute a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device, for example.

According to example embodiments of the inventive concepts, it is possible to realize a magnetic tunnel junction MTJ, and a magnetic memory device incorporating the MTJ, having better reliability as compared to the magnetic memory device formed using a conventional dry etching process. Further, it is possible to more easily perform a patterning process for forming the magnetic tunnel junction MTJ and consequently realize a magnetic memory device having an increased integration density.

While example embodiments of the inventive concepts have been particularly shown and described, it will be understood by one of ordinary skill in the art that variations in form and detail may be made thereto without departing from the spirit and scope of the attached claims.

What is claimed is:

1. A magnetic memory device, comprising:
   a lower electrode arranged on a substrate;
   a first magnetic pattern arranged on the lower electrode;
   a second magnetic pattern arranged on the first magnetic pattern, the second magnetic pattern having a width smaller than that of the first magnetic pattern;
   a tunnel barrier pattern disposed between the first and second magnetic patterns;
   an upper electrode provided on the second magnetic pattern with a capping pattern interposed between the upper electrode and the second magnetic pattern;
   a capping spacer arranged on a sidewall of the capping pattern and a sidewall of the upper electrode, wherein the capping spacer is spaced apart from the tunnel barrier pattern;
   a re-deposition spacer provided between the capping pattern and the capping spacer and extending between the upper electrode and the capping spacer, wherein the re-deposition spacer is spaced apart from the tunnel barrier pattern; and
   an oxide pattern extending from a top surface of the tunnel barrier pattern to a bottom surface of the capping spacer, the bottom surface of the capping spacer being at a height above the substrate that is between a height of a bottom surface of the second magnetic pattern and a height of a top surface of the second magnetic pattern,
   wherein the oxide pattern is disposed between the bottom surface of the capping spacer and the top surface of the tunnel barrier pattern and between a bottom surface of the re-deposition spacer and the top surface of the tunnel barrier pattern,
   wherein the oxide pattern comprises an oxide of a material of the second magnetic pattern, and
   wherein the re-deposition spacer includes a material that is the same as a material of the upper electrode.

2. The magnetic memory device of claim 1, wherein the capping spacer comprises a metal oxide.

3. The magnetic memory device of claim 2,
wherein the capping spacer has a thickness ranging from about 30 Å to about 50Å.

4. The magnetic memory device of claim 1,
wherein a sidewall of the tunnel barrier pattern and a sidewall of the first magnetic pattern are self-aligned to a sidewall of the capping spacer.

5. The magnetic memory device of claim 1,
wherein the bottom surface of the capping spacer is in contact with a top surface of the oxide pattern.

6. The magnetic memory device of claim 1,
wherein a difference in width between the first and second magnetic patterns is equal to or greater than a width of the capping spacer.

7. The magnetic memory device of claim 1,
wherein the re-deposition spacer further includes a material that is the same as at least one of materials of the second magnetic pattern and the capping pattern.

8. The magnetic memory device of claim 1,
wherein a top surface of the oxide pattern is in contact with the bottom surface of the capping spacer and the bottom surface of the re-deposition spacer, and
wherein a bottom surface of the oxide pattern is in contact with the top surface of the tunnel barrier pattern.

9. The magnetic memory device of claim 1, further comprising:
an additional oxide pattern between a portion of the first magnetic pattern and the tunnel barrier pattern,
wherein the additional oxide pattern is spaced apart from the lower electrode so that the portion of the first magnetic pattern is interposed between the additional oxide pattern and the lower electrode.

10. A magnetic memory device, comprising:
a lower electrode disposed on a substrate;
a first magnetic pattern disposed on the lower electrode, the first magnetic pattern including a first portion having a first width and a second portion having a second width smaller than the first width, the second portion protruding from a top surface of the first portion;
a second magnetic pattern arranged on the first magnetic pattern;
a tunnel barrier pattern located between the first and second magnetic patterns, wherein a bottom surface of the tunnel barrier pattern is in direct contact with the second portion of the first magnetic pattern and spaced apart from the first portion of the first magnetic pattern;
an upper electrode provided on the second magnetic pattern with a capping pattern interposed therebetween;
a capping spacer on a sidewall of the capping pattern and a sidewall of the upper electrode, wherein the capping spacer is spaced apart from the tunnel barrier pattern;
a metal oxide pattern extending from a top surface of the tunnel barrier pattern to a bottom surface of the capping spacer, the bottom surface of the capping spacer being at a height above the substrate that is between a height of a bottom surface of the second magnetic pattern and a height of a top surface of the second magnetic pattern; and
a re-deposition spacer provided between the capping pattern and the capping spacer and extending between the upper electrode and the capping spacer, the re-deposition spacer comprising at least one material in the second magnetic pattern, and the re-deposition spacer being spaced apart from the tunnel barrier pattern,
wherein the first portion of the first magnetic pattern, the tunnel barrier pattern, and the metal oxide pattern each has a sidewall that is self-aligned to a sidewall of the capping spacer, and
wherein a portion of the metal oxide pattern is disposed between the bottom surface of the capping spacer and the top surface of the tunnel barrier pattern and between a bottom surface of the re-deposition spacer and the top surface of the tunnel barrier pattern.

11. The magnetic memory device of claim 10,
wherein a difference between the first width of the first portion of the first magnetic pattern and a width of the second magnetic pattern is equal to or greater than a width of the capping spacer.

12. A magnetic memory device, comprising:
a lower electrode disposed on a substrate;
a magnetic memory element comprising:
a first magnetic pattern and a second magnetic pattern disposed on the lower electrode in a stacked arrangement, and
a tunnel barrier pattern arranged between the first magnetic pattern and the second magnetic pattern, the first magnetic pattern being disposed proximately to the lower electrode and the second magnetic pattern being disposed distally to the lower electrode,
wherein the first magnetic pattern includes a first portion having a first width and a second portion having a second width smaller than the first width,
wherein the second portion protrudes from a top surface of the first portion, and
wherein a bottom surface of the tunnel barrier pattern is in direct contact with the second portion of the first magnetic pattern and spaced apart from the first portion of the first magnetic pattern;
an upper electrode provided above the magnetic memory element;
a capping pattern interposed between the magnetic memory element and the upper electrode;
a capping spacer arranged along a sidewall of the capping pattern and a sidewall of the upper electrode, wherein the capping spacer is spaced apart from the tunnel barrier pattern; and
a re-deposition spacer provided between the upper electrode and the capping spacer and between the capping pattern and the capping spacer, the re-deposition spacer comprising at least one material in the second magnetic pattern and the re-deposition spacer being spaced apart from the tunnel barrier pattern,
wherein a sidewall of the first magnetic pattern and a sidewall of the tunnel barrier pattern are self-aligned to a sidewall of the capping spacer.

13. The magnetic memory device of claim 12, further comprising:
a metal oxide pattern including a first portion extending from a top surface of the tunnel barrier pattern to a bottom surface of the capping spacer, the bottom surface of the capping spacer being at a height above the substrate that is between a height of a bottom surface of the second magnetic pattern and a height of a top surface of the second magnetic pattern, the metal oxide pattern further including a second portion surrounding a sidewall of the second portion of the first magnetic pattern and covering the top surface of the first portion of the first magnetic pattern, wherein the first portion of the metal oxide pattern is disposed between the bottom surface of the capping spacer and the top surface of the tunnel barrier pattern, and wherein the first portion of the metal oxide pattern is further disposed between a bottom surface of the re-deposition spacer and the top surface of the tunnel barrier pattern.

14. The magnetic memory device of claim 13, wherein the metal oxide pattern has a sidewall that is self-aligned to the sidewall of the capping spacer.

15. The magnetic memory device of claim 12, further comprising:

an interfacial pattern arranged on the second magnetic pattern to induce an interface driven perpendicular anisotropy in the second magnetic pattern, wherein the capping pattern is further arranged on the interfacial pattern.

16. The magnetic memory device of claim 12, wherein the capping spacer has a thickness of approximately between about 30 Å to about 50Å.

17. The magnetic memory device of claim 12, wherein the first width of the first portion of the first magnetic pattern is greater than a width of the second magnetic pattern.

18. The magnetic memory device of claim 17, wherein a difference between the first width of the first portion of the first magnetic pattern and the width of the second magnetic pattern is greater than or equal to a width of the capping spacer.

* * * * *